United States Patent
Blackwell et al.

(10) Patent No.: US 9,932,671 B2
(45) Date of Patent: Apr. 3, 2018

(54) PRECURSOR AND PROCESS DESIGN FOR PHOTO-ASSISTED METAL ATOMIC LAYER DEPOSITION (ALD) AND CHEMICAL VAPOR DEPOSITION (CVD)

(71) Applicant: Intel Corporation, Santa Clara, CA (US)

(72) Inventors: James M. Blackwell, Portland, OR (US); Patricio E. Romero, Portland, OR (US); Scott B. Clendenning, Portland, OR (US); Grant M. Kloster, Lake Oswego, OR (US); Florian Gstrein, Portland, OR (US); Harsono S. Simka, Saratogo, CA (US); Paul A. Zimmerman, Phoenix, AZ (US); Robert L. Bristol, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/119,699

(22) PCT Filed: Mar. 27, 2014

(86) PCT No.: PCT/US2014/032073
§ 371 (c)(1),
(2) Date: Aug. 17, 2016

(87) PCT Pub. No.: WO2015/147843
PCT Pub. Date: Oct. 1, 2015

(65) Prior Publication Data
US 2017/0058401 A1    Mar. 2, 2017

(51) Int. Cl.
*H01L 21/336* (2006.01)
*C23C 16/455* (2006.01)
*C23C 16/18* (2006.01)
*C23C 16/48* (2006.01)
(Continued)

(52) U.S. Cl.
CPC ........ *C23C 16/45553* (2013.01); *C23C 16/18* (2013.01); *C23C 16/482* (2013.01);
(Continued)

(58) Field of Classification Search
None
See application file for complete search history.

(56) References Cited

U.S. PATENT DOCUMENTS

| | | |
|---|---|---|
| 6,589,717 B1 | 7/2003 | Ghandehari et al. |
| 2002/0106890 A1 | 8/2002 | Ahn et al. |

(Continued)

FOREIGN PATENT DOCUMENTS

| | | |
|---|---|---|
| JP | H05186875 | 7/1993 |
| WO | WO-2004010469 | 1/2004 |

OTHER PUBLICATIONS

International Preliminary Report on Patentability for PCT Patent Application No. PCT/US2014/032073 dated Oct. 6, 2016, 9 pgs.

(Continued)

*Primary Examiner* — Calvin Choi
(74) *Attorney, Agent, or Firm* — Schwabe, Williamson & Wyatt, P.C.

(57) ABSTRACT

Precursor and process design for photo-assisted metal atomic layer deposition (ALD) and chemical vapor deposition (CVD) is described. In an example, a method of fabricating a thin metal film involves introducing precursor molecules proximate to a surface on or above a substrate, each of the precursor molecules having one or more metal centers surrounded by ligands. The method also involves depositing a metal layer on the surface by dissociating the ligands from the precursor molecules using a photo-assisted process.

8 Claims, 21 Drawing Sheets

(51) Int. Cl.
*H01L 21/768* (2006.01)
*H01L 21/285* (2006.01)
*H01L 29/66* (2006.01)
*H01L 21/033* (2006.01)

(52) U.S. Cl.
CPC .... *H01L 21/0337* (2013.01); *H01L 21/28556* (2013.01); *H01L 21/28562* (2013.01); *H01L 21/76816* (2013.01); *H01L 21/76879* (2013.01); *H01L 21/76897* (2013.01); *H01L 29/66795* (2013.01)

(56) References Cited

U.S. PATENT DOCUMENTS

| | | | | |
|---|---|---|---|---|
| 2006/0223300 | A1* | 10/2006 | Simka | C23C 16/18 438/618 |
| 2011/0253197 | A1* | 10/2011 | Mapel | H01L 31/055 136/247 |
| 2012/0086128 | A1 | 4/2012 | Ponoth et al. | |
| 2013/0052368 | A1 | 2/2013 | Rushworth et al. | |
| 2014/0264561 | A1* | 9/2014 | Masuoka | H01L 29/66666 257/329 |

OTHER PUBLICATIONS

International Search Report and Written Opinion for PCT Patent Application No. PCT/US2014/032073 dated Dec. 11, 2014, 12 pgs.
Hwang Seongdon et al, Materials, Science & Engineering B (Solid-State Materials for Advanced Technology) Switzerland, Vol. B30, NR. 1, XP002774346, ISSN: 0921-5107, Feb. 1, 1995.
Potapenko D V et al: "Reactivity studies with gold-supported molybdenum nanoparticles", Surface Science, North-Holland, Amsterdam, NL, vol. 574, No. 2-3, pp. 244-258, XP027858676, ISSN: 0039-6028, Jan. 10, 2005.
Search Report for European Patent Application No. 14887657.6, dated Nov. 8, 2017, 14 pages.

* cited by examiner

500A

| Reaction | Bond Dissociation Energy at 0K (eV) |
|---|---|
| Mo(CO)6 -> Mo(CO)5 + CO | 1.7 |
| Mo(CO)5 -> Mo(CO)4 + CO | 2.7 |
| Mo(CO)4 -> Mo(CO)3 + CO | 1.7 |
| Mo(CO)3 -> Mo(CO)2 + CO | 2.0 |
| Mo(CO)2 -> Mo(CO) + CO | 1.6 |
| Mo(CO) -> Mo + CO | 1.8 |
| Mo(CO)4-DAZB -> Mo(CO)3-DAZB (tbutyl) +CO | 1.5 |
| Mo(CO)4-DAZB -> Mo(CO)3-DAZB (methyl) + CO | 1.6 |
| Mo(CO)4-DAZB -> Mo(CO)4 + DAZB (tbutyl) | 3.5 |
| Mo(CO)4-DAZB -> Mo(CO)4 + DAZB (methyl) | 3.8 |

FIG. 5A

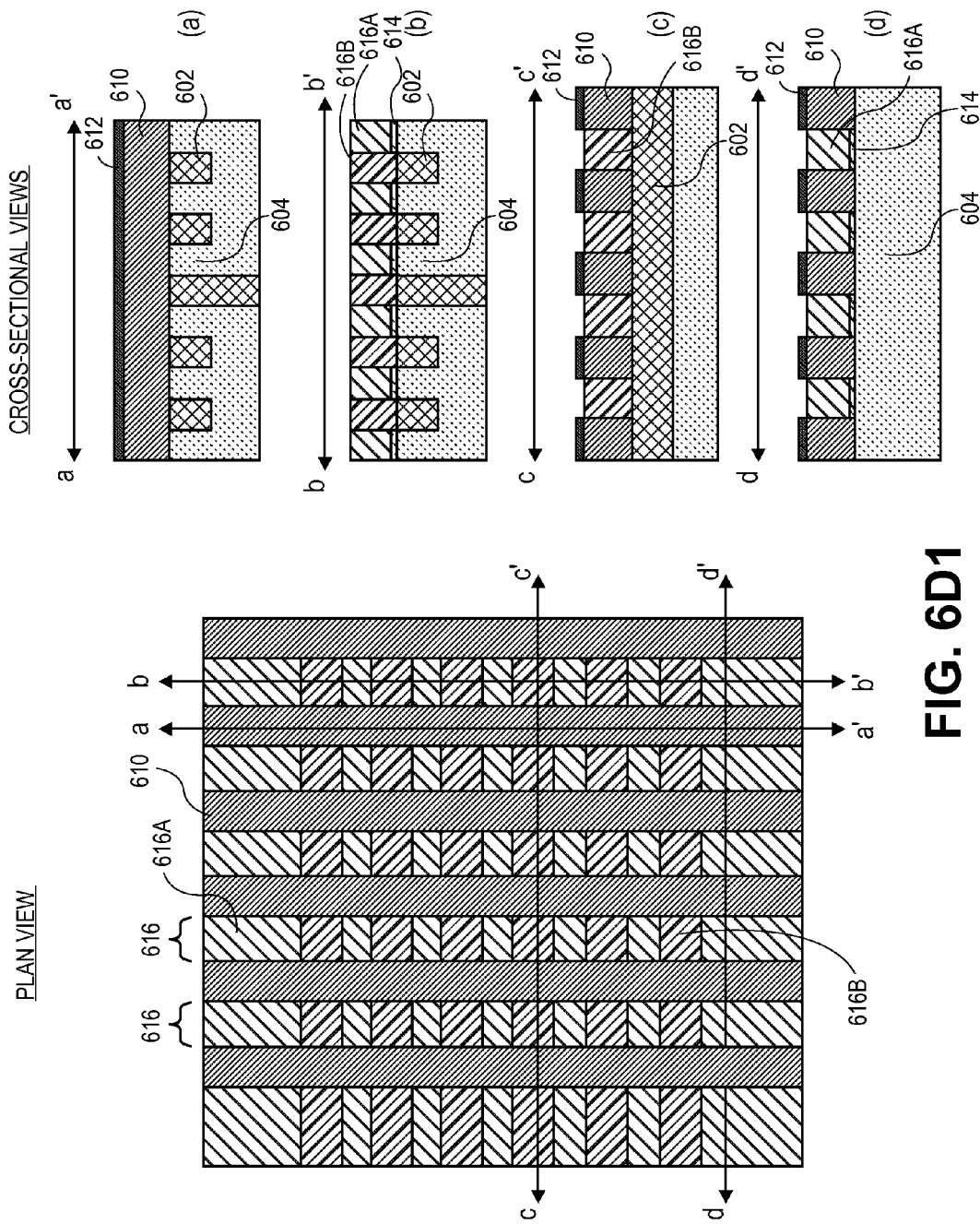
FIG. 6D1

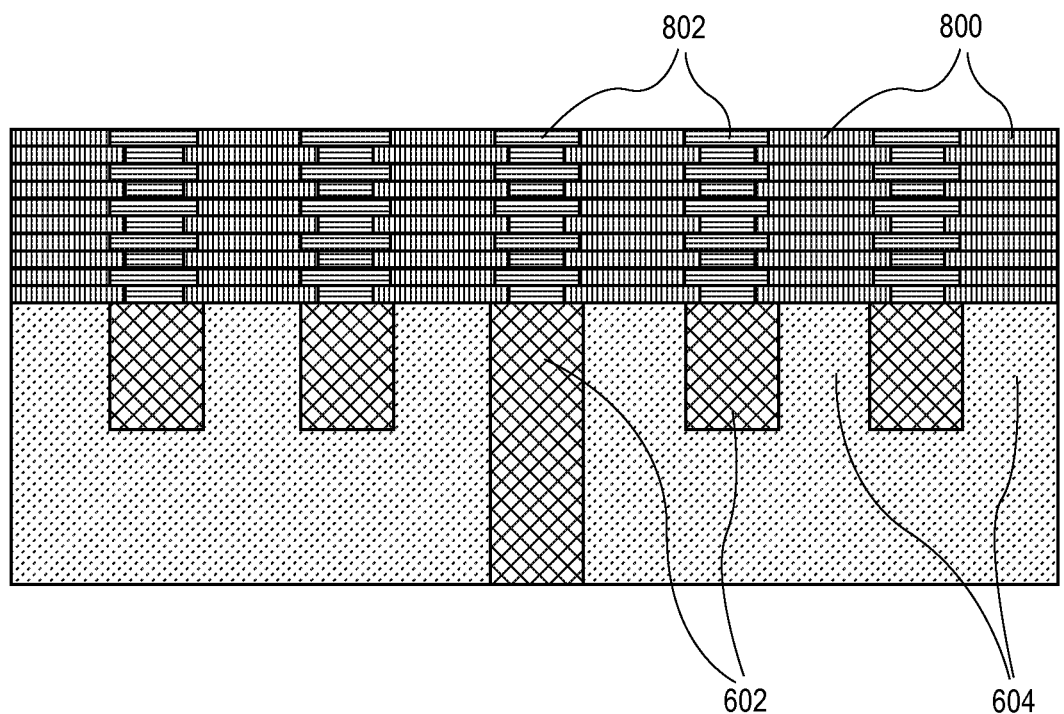
FIG. 6D2

PRECURSOR AND PROCESS DESIGN FOR PHOTO-ASSISTED METAL ATOMIC LAYER DEPOSITION (ALD) AND CHEMICAL VAPOR DEPOSITION (CVD)

CLAIM OF PRIORITY

This patent application is a U.S. National Phase application under 35 U.S.C. § 371 of International Application No. PCT/US2014/032073, filed Mar. 27, 2014, entitled "PRECURSOR AND PROCESS DESIGN FOR PHOTO-ASSISTED METAL ATOMIC LAYER DEPOSITION (ALD) AND CHEMICAL VAPOR DEPOSITION (CVD)," the entire contents of which are incorporated herein by reference.

TECHNICAL FIELD

Embodiments of the invention are in the field of semiconductor structures and processing and, in particular, precursor and process design for photo-assisted metal atomic layer deposition (ALD) and chemical vapor deposition (CVD).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

In a first aspect, integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias. When patterning extremely small vias with extremely small pitches by such lithographic processes, several challenges present themselves, especially when the pitches are around 70 nanometers (nm) or less and/or when the critical dimensions of the via openings are around 35 nm or less.

One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up. Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU). Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing. A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

Thus, improvements are needed in the area of via manufacturing technologies.

In a second aspect, multi-gate transistors, such as tri-gate transistors, have become more prevalent as device dimensions continue to scale down. In conventional processes, tri-gate or other non-planar transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Thus, improvements are needed in the area of non-planar transistor manufacturing technologies.

BRIEF DESCRIPTION OF THE DRAWINGS

FIG. 5A is a plot showing calculated bond dissociation energies of ligands in $Mo(CO)_6$ and $Mo(CO)_4$(1,4-N,N'-ditertbutyldiazabutadiene), in accordance with one or more embodiments of the present invention.

FIGS. 6A-6L illustrate portions of integrated circuit layers representing various operations in a method of self-aligned via and metal patterning, in accordance with an embodiment of the present invention, where:

FIG. 6A illustrates a plan view and corresponding cross-sectional views of options for a previous layer metallization structure;

FIG. 6B illustrates a plan view and corresponding cross-sectional views of the structure of FIG. 6A following formation of interlayer dielectric (ILD) lines above the structure of FIG. 6A;

FIG. 6C illustrates a plan view and corresponding cross-sectional views of the structure of FIG. 6B following selective differentiation of all the potential via locations from all of the plug locations;

FIG. 6D1 illustrates a plan view and corresponding cross-sectional views of the structure of FIG. 6C following differential polymer addition to the exposed portions of underlying metal and ILD lines of FIG. 6C;

FIG. 6D2 illustrates a cross-sectional view of the structure of FIG. 6B following selective material deposition on the exposed portions of underlying metal and ILD lines, in accordance with another embodiment of the present invention;

FIG. 6E illustrates a plan view and corresponding cross-sectional views of the structure of FIG. 6D1 following removal of one species of polymer;

FIG. 6F illustrates a plan view and corresponding cross-sectional views of the structure of FIG. 6E following formation of an ILD material in the locations opened upon removal of the one species of polymer;

FIG. 6G illustrates a plan view and corresponding cross-sectional views of the structure of FIG. 6F following via patterning;

FIG. 6H illustrates a plan view and corresponding cross-sectional views of the structure of FIG. 6G following via formation using a selective metal deposition process;

FIG. 6I illustrates a plan view and corresponding cross-sectional views of the structure of FIG. 6H following removal of the second species of polymer and replacement with an ILD material;

FIG. 6J illustrates a plan view and corresponding cross-sectional views of the structure of FIG. 6I following patterning of a resist or mask in selected plug locations;

FIG. 6K illustrates a plan view and corresponding cross-sectional views of the structure of FIG. 6J following hardmask removal and ILD layer recessing;

FIG. 6L illustrates a plan view and corresponding cross-sectional views of the structure of FIG. 6K following metal line formation.

DESCRIPTION OF THE EMBODIMENTS

Figure 1:
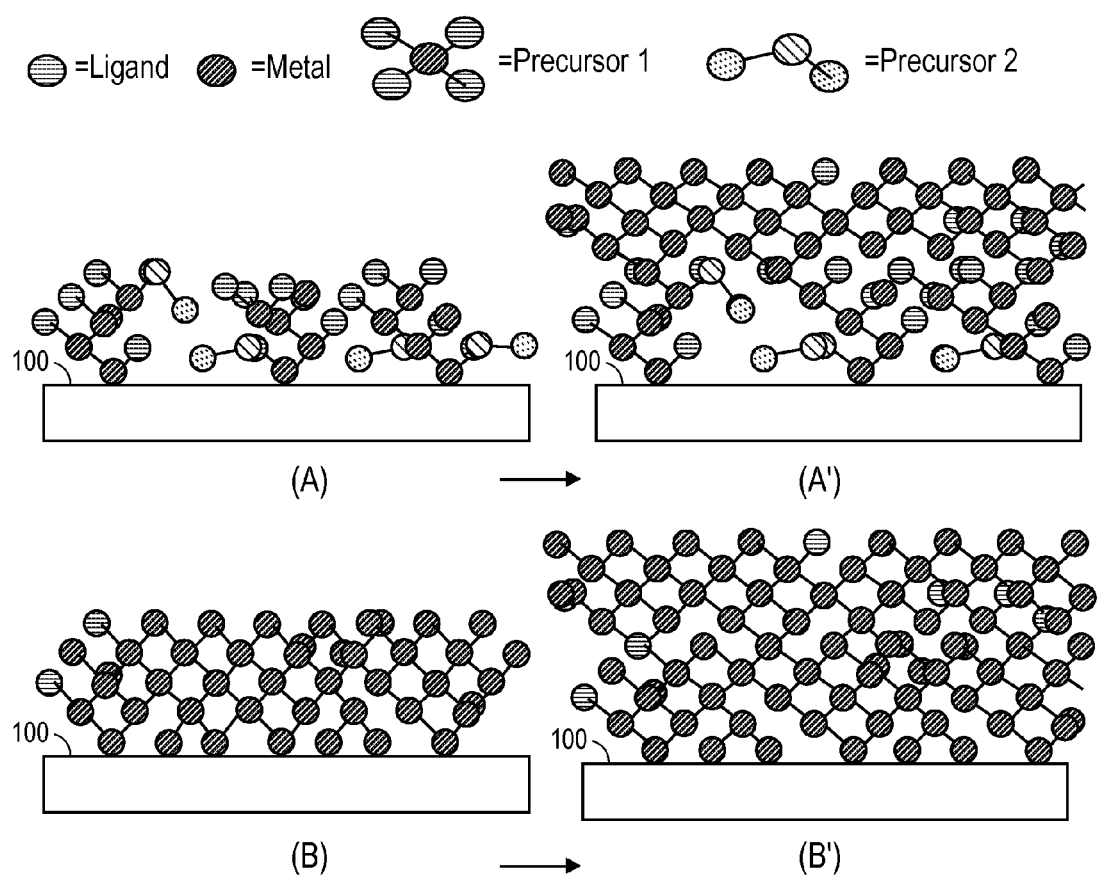
FIG. 1 shows a schematic depicting layer growth and composition of an ALD process without (A→A') and with (B→B') photolytic-assist, in accordance with an embodiment of the present invention.

Precursor and process design for photo-assisted metal atomic layer deposition (ALD) and chemical vapor deposition (CVD) is described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to precursor and process design for photo-assisted metal ALD (or CVD). Aspects may include the fabrication of conformal thin metal films, nucleation enhancement, and thin metal film synthesis for device, interconnect and system-on-chip (SOC) applications.

More generally, one or more embodiments address the design of precursors and process conditions for photo-assisted conformal thin metal film deposition by atomic layer deposition (ALD) and chemical vapor deposition (CVD). For example, the deposition of ultrathin (e.g., less than 3 nanometer) ALD/CVD films of many metals is an unsolved challenge for the semiconductor industry. In many cases, no ALD/CVD process exists for the desired conformal metal film. In other cases, state-of-the art deposition conditions are incompatible with substrates of interest or the thickness of the film required. Furthermore, due to low surface energies, many metals have a tendency to de-wet or agglomerate in high energy environments such as high substrate temperatures and/or plasma enhanced ALD conditions. As a result, producing physically and electrically continuous ultrathin ALD/CVD metal films requires gentle, targeted approaches to enable efficient surface reactions under low energy conditions. Also, efficient nucleation of a metal ALD film may be critical to obtaining physical closure at less than 3 nanometers, which is required at numerous locations in the device and interconnect stack of advanced technologies.

More specifically, one or more embodiments described herein is directed to precursor chemistry design that can be used to enable photons to promote surface reactions. Such surface reactions may be induced to occur under conditions at which they either would not otherwise occur or would require much more energetic conditions such as the introduction of plasma co-reactants. In an embodiment, photons are adsorbed by a precursor, co-reactant molecule or derived fragment on the surface, or the surface itself, providing targeted energy to break bonds and cause a reaction to produce a film without requiring high temperature or plasma activation. Accordingly, the use of photo-assisted ALD/CVD can lead to the deposition of otherwise unattainable materials and/or enable desirable film properties such as higher nucleation density for continuous ultrathin (e.g., less than 3 nanometer) films. In an embodiment approaches described herein can be implemented as a solution to address materials and scaling challenges throughout the device and interconnect stack.

To provide further context, in contrast to state-of-the-art approaches, one or more embodiments described herein involve the use of photons of tunable energy to target desirable bond cleavage and reactions that either would not occur under other less discriminate activation such as high substrate temperature and/or plasma co-reactants or would be overwhelmed by undesirable side reactions. In one such embodiment, photochemical reaction mechanisms are accessed to enable the deposition of otherwise unattainable materials or to obtain a similar material with improved film properties such as lower resistivity, higher purity and less roughness. In an embodiment, differing absorptivity of two surfaces is implemented to favor selective deposition on one surface versus another, where photo-adsorption at the selected surface enhances nucleation and subsequent film growth.

In accordance with an embodiment of the present invention, photo-assisted conformal metal thin film deposition by ALD and/or CVD is enabled with a precursor and/or co-reactant designed to react with light of a specific wavelength or wavelength range. The light is applied to a substrate in the presence of the photo-active molecule or a surface adsorbate. In one embodiment, the substrate photolysis induces a redox reaction. In one embodiment, the substrate photolysis affects the dissociation of volatile neutral ligands. In one embodiment, the substrate photolysis causes desirable chemical rearrangements of surface species. In one embodiment, the substrate photolysis activates a chemical bond causing a reaction with a co-reactant that otherwise would not occur. It is to be appreciated that one or more of the above listed embodiments might work together or independent from one another. In accordance with an embodiment of the present invention, advantages of such approaches include, but need not be limited by or to, (1) the enabling of ALD/CVD deposition of metals for which no thermal or plasma-enhanced process currently exists, (2) the using of photolytic energy to create lower deposition temperature ALD/CVD processes, (3) the enabling of selective metal ALD/CVD by activating surface species on one surface over another thus enabling selective nucleation and film growth, (4) the reducing of film contaminants by either more efficient reactions or the elimination of a chemical co-reactant, (5) enhanced nucleation by increasing the number of initial reactive surface sites to enable access to ultrathin conformal films (e.g., reducing an associated transition interface), or (6) the reducing of damage to the underlying substrate during the ALD/CVD nucleation stage. Such advantages of using photolytically-assisted ALD deposition can be implemented to improve film purity, continuity and density, resulting in lower resistance.

FIG. 1 shows a schematic depicting layer growth and composition of an ALD process without (A→A') and with (B→B') photolytic-assist, in accordance with an embodiment of the present invention.

Referring to pathway (A) of FIG. 1, a substrate or layer surface 100 is showing following ALD growth after 5-10 cycles without the aid of photolysis. The surface is shown again as (A') following 15 cycles of growth, again without the aid of photolysis. By contrast, referring to pathway (B) of FIG. 1, a substrate or layer surface 102 is showing following ALD growth after 5-10 cycles with the aid of photolysis. The surface is shown again as (B') following 15 cycles of growth, again with the aid of photolysis. Thus, as depicted in pathway (B), increased nucleation density and purity may be achieved with photo-assistance during deposition of a metal film.

In accordance with another embodiment of the present invention, the ability to perform photo-assisted ALD/CVD hinges on the tailored design of photoactive metal precursors and/or co-reactants. In an example, for the metal precursor, ligands are arranged around the metal center to enable absorption of a particular range of wavelengths of light and, as a result, to effect a particular chemical reaction. The targeted reactivity may be induced by the absorption of one or multiple photons at one or more wavelengths. For example, in one embodiment, an excited state is achieved by a photon of one wavelength, while a second photon of the same or another wavelength is used to drive the reaction to completion.

In accordance with more specific embodiments, cobalt complexes which are volatile and possess other favorable properties for ALD are used to fabricate a high quality, thin cobalt metal layer. In a particular embodiment, $(CO)_3CoNO$ expels both CO and NO groups upon photo-activation with light in 200-250 nanometer range, at a temperature below room temperature. Such a mechanism for the clean loss of NO at low temperature enables the fabrication of purer Co films to be accessed, free of nitrogen (N). Other embodiments involve the use of mixed carbonyl/nitroso cobalt complexes, where one or more CO groups are replaced with small ligands such as phosphines, N-heterocyclic carbenes, isocyanides etc.

Figure 2:
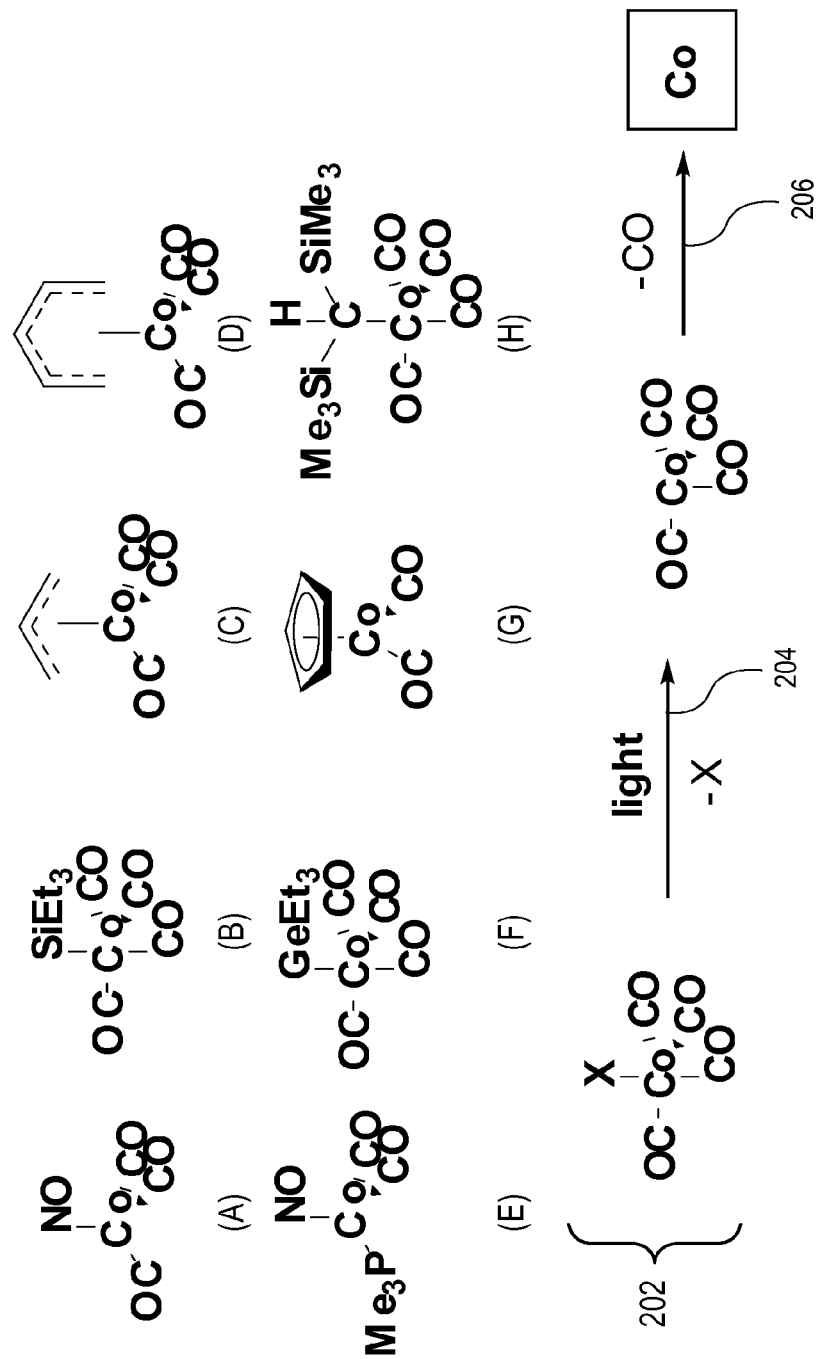
FIG. 2 illustrates a variety of suitable cobalt (Co) complexes for undergoing photo-assisted ALD and/or CVD, in accordance with an embodiment of the present invention.

In general, an extensive number of Co(I) carbonyl complexes of general formula $(CO)2Co$—X, $(CO)_3Co$—X or $(CO)_4Co$—X are known to be stable and volatile complexes, but do not perform well during ALD/CVD processes due to strong Co—X bonds leading to either low deposition or to impurity incorporation. The X substituent typically includes alkyls, allyls, cyclopentadienyls, pentadienyls, germyls, silyls, stannyls, boryls and other common mono-anionic organic fragments. However, many of these such molecules possess photo-reactivity involving homolysis of the Co—X bond, thus providing a low temperature method for removing the X fragment and converting Co from the +1 oxidation state to 0. FIG. 2 illustrates a variety of suitable cobalt (Co) complexes for undergoing photo-assisted ALD and/or CVD, in accordance with an embodiment of the present invention. Referring to FIG. 2, suitable Co complexes include, but are not limited to, $(CO)_3CoNO$ (A), $(CO)_4CoSiEt_3$ (B), $(CO)_3Co$-allyl (C), $(CO)_3Co$-pentadienyl (D), $(CO)_2Co(NO)(PMe_3)$ (E), $(CO)_4CoGeEt_3$ (F), $(CO)_2CoCp$ (G), and $(CO)_4CoC(H)(SiMe_3)_2$ (H). A general photolytic pathway is depicted in scheme 202 of FIG. 2, where a Co compound is exposed to light to remove "X" (204), followed by expulsion of "CO" to provide pure cobalt (206).

In accordance with another specific embodiment, molybdenum (Mo) carbonyls are subjected to photochemical activation to assist deposition of pure metal through photo-dissociation of CO and other small ligands. In a particular embodiment, in addition to $Mo(CO)_6$, mixed systems such as $(nbd)Mo(CO)_4$ and $(nbd)_2Mo(CO)_2$ are used to tune the photo-dissociation of multiple CO groups and the supporting ligands, where nbd is norbornadiene. Additionally, ligands (L) other than ndb are used such, but not limited to, N-heterocyclic carbenes, diazabutadienes, phosphines, phosphites, isonitriles, sulfides, amines, or pyridines. In an embodiment, such supporting L groups can be used to enhance chemisorption to a deposition surface and to decrease the CO dissociation energy. In another embodiment, L groups that are more readily photo-dissociated are used, thus generating unsaturated $Mo(CO)_n$ fragments on the surface which then rapidly decomposes to Mo metal.

In accordance with another embodiment, photo-adsorption of surface species is performed to generate reactive species at the deposition surface which are designed to reduce or otherwise interact with incoming metal precursors. In an exemplary embodiment, chromophores such as anthracenes or other aromatic molecules are used to participate in photo-initiated electron transfer reactions where the chromophore is photo-excited leading to release of an electron to nearby electrophiles/oxidants, thereby enhancing nucleation and the overall film growth rate. In a particular example, a deposition surface is selectively decorated through the attachment of anthracenyl self-assembled monolayer (SAM)-forming molecules prior to chemisorption of ALD precursors. Subsequent photolysis is used for chromophore activation, triggering electron transfer to nearby ALD precursors.

Figure 3:
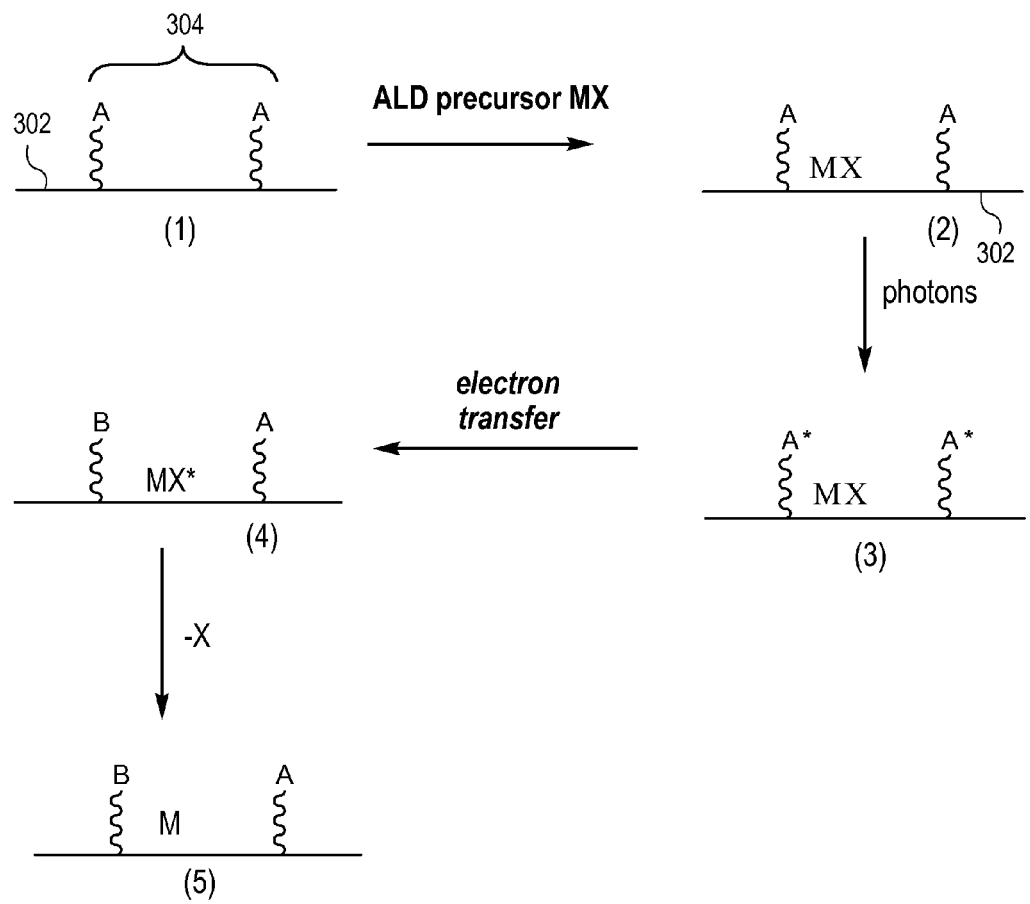
FIG. 3 depicts a generic scheme illustrating photo-initiated electron transfer at a surface, in accordance with an embodiment of the present invention.

As an example, FIG. 3 depicts a generic scheme illustrating photo-initiated electron transfer at a surface, in accordance with an embodiment of the present invention. Referring to FIG. 3, the process begins (1) with a surface 302 having chromophores (A) pre-attached to the surface 302 through chemical anchoring (e.g. thiols, phosphonic acids, silanes, etc), collectively referred to as 304. In (2), an ALD precursor (MX) is deposited on the surface 302. Light exposure (photons) is then performed to provide (3), with activated chromophores (A*). Electron transfer to the MX species is then effected from one of the activated chromophores, providing MX*, where the chromophore from the electron transfer occurred is now depicted as B. As shown in (5), loss of (X) is facilitated by the photo-initiated electron transfer reactions to the MX species, ultimately leading to pure metal (M) deposition on the surface 302. In accordance with an embodiment of the present invention, the process depicted in FIG. 3 lends itself to selective nucleation since the activating groups can be positioned selectively on one substrate (e.g., metal) over another (e.g., dielectric). In yet another embodiment, the photo-adsorptivity of an untreated surface is used to provide the same effect where, for example, a metal surface is excited leading to photo-ejection of an electron from the surface to the chemisorbed precursor. Thus, a pure metal layer may be selectively deposited on a metal surface (and not on a corresponding dielectric surface) by photo-assisted ALD. This process can be made self-perpetuating by tuning incoming wavelength of light to new chromophores being selectively deposited on the surface. For example, one might start with one wavelength during selective nucleation and change to second wavelength during remainder of the process. By limiting photoabsorption to the surface and not to the precursors, unwanted activation of precursors in gas phase can be prevented.

In accordance with another embodiment of the present invention, metal/ILD patterns are exposed with appropriate deep ultra-violet (DUV) light (this may not be limited to only DUV) to activate only molecules chemisorbed on interlayer dielectric (ILD) surfaces and not on metal surfaces. The resulting selectivity is possible through reflection of most of the light energy away from the metal surface, preventing photo-absorption by chemisorbed molecules. On the other hand, molecules chemisorbed on the ILD surface absorb light, allowing photochemical reactions linked to nucleation and film growth to occur efficiently. Thus, contrasting the above example, a pure metal layer may be selectively deposited on a dielectric surface (and not on a corresponding metal surface) by photo-assisted ALD. It is to be appreciated that the above described approach may not be limited to only deposition of metals but can also be designed to deposit dielectric materials selectively, using photochemically driven ALD/CVD processes.

Figure 4:
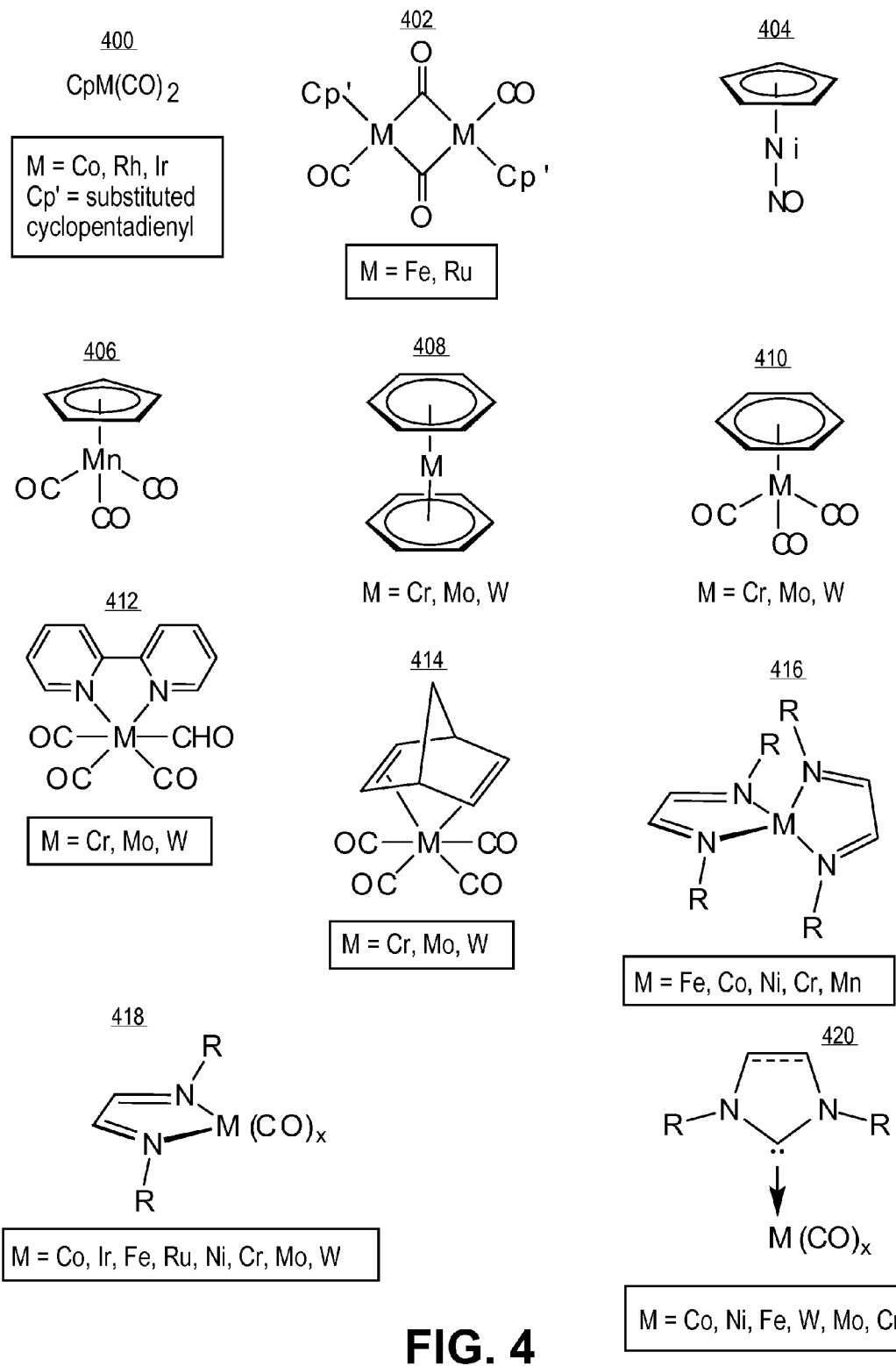
FIG. 4 illustrates a variety of structural motifs suitable as metal precursors for photo-assisted ALD and/or CVD of pure metal films, in accordance with one or more embodiments of the present invention.

In accordance with additional embodiments of the present invention, other families of molecules with latent potential to serve as precursors for photo-assisted thin film deposition include, but are not limited to (A) mono and polynuclear metal carbonyl complexes of the transition metals, (B) metallorganic complexes containing π-bonded ligands such as cyclopentadienyl, indenyl, benzenoid aromatic rings, allyl, pentadienyl, cyclooctatetraenyl, etc, (C) Piano stool metallorganic complexes with π-bonded ligands such as carbonyl, nitrosyl, silyl, germyl and any combination thereof, (D) heteroleptic and homoleptic complexes containing a diazabutadiene core, (E) heteroleptic and homoleptic complexes containing pyridyl based ligands such as pyridine, bipyridine, phenantroline, etc., (F) complexes containing diazo and stiryl based ligands, or (G) homoleptic and heteroleptic metallorganic complexes containing NHC-carbene ligands. FIG. 4 illustrates a variety of structural motifs suitable as metal precursors for photo-assisted ALD and/or CVD of pure metal films, in accordance with one or more embodiments of the present invention. Referring to FIG. 4, examples of (A) are depicted as 400, 402, 406, 410, 412, 414, 418 and 420. Examples of (B) are depicted as 400, 402, 404, 406, 408, 410 and 414. Examples of (C) are depicted as 406 and 410. Examples of (D) are depicted as 416 and 418. An example of (E) is depicted as 412. An example of (G) is depicted as 420.

Thus, embodiments are directed to forming ultrathin, conformal metallic films using photo-assisted ALD/CVD processing. Although not so limited, embodiments may be implemented to fabricate thin metal films of high purity having a thickness approximately equal to or less than 3 nanometers, at relatively low temperatures approximately in the range of 25-200 degrees Celsius, and using light having a wavelength approximately in the range of 150-800 nanometers. Coreactants could range from $H_2$ to $NH_3$, TMA, hydrazine, hydrosilanes, boranes, $O_2$, $O_3$, $H_2O$ etc., where they react faster with precursor in excited state. However, in another embodiment, the coreactant is photoactive. In a specific embodiment, a hydrosilane is used where photons cleave Si—H bonds to form radicals; or Si—Si bonds; or Si-allyl bonds, etc. In general, photons perform similar reactions to plasma but in a much more controlled targeted sense. That is, the photochemistry of coreactants can be used instead of or together with photochemistry of precursor. In general, embodiments described herein detail unique photoactive precursor chemistry that can enable the photo-assisted ALD/CVD of metal films of general interest to the semiconductor (and related) industry. Photolysis may be effected by one or more of (a) extrusion of small diatoms such as CO and NO from metal centers, (b) homolysis of M-X bonds (e.g., Co—C), (c) reductive elimination of two anionic substituents (e.g., $MR_2 \rightarrow M+R$—R), and (d) ring-slippage and eventual dissociation of cyclopentadienyl and related ligands.

Figure 5B:
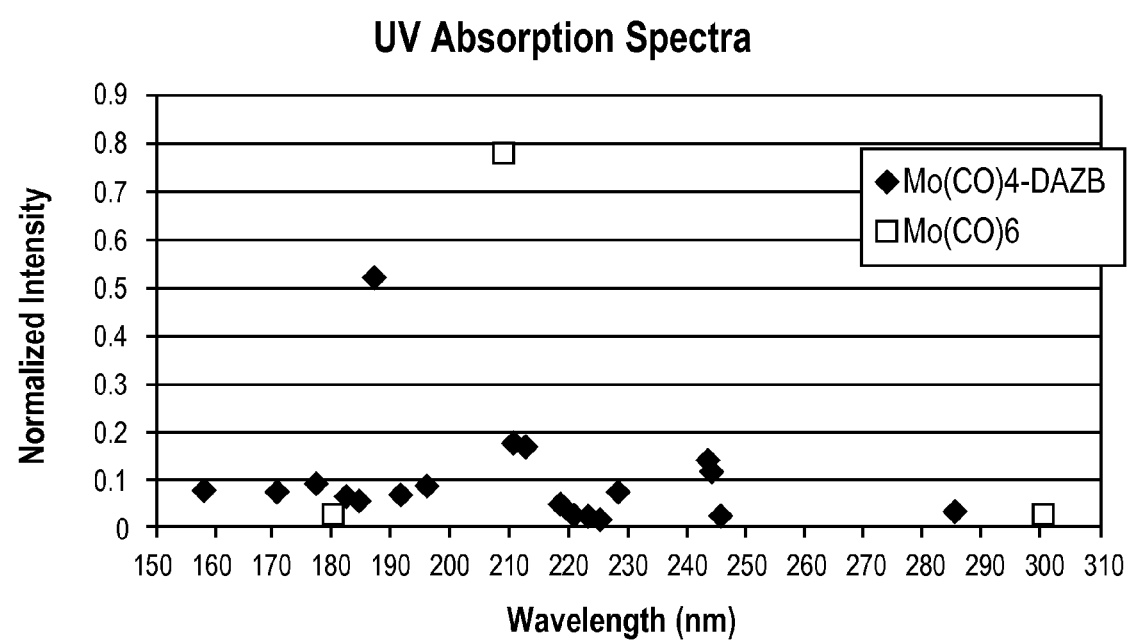
FIG. 5B is a plot showing the DFT calculated normalized UV absorption intensity as a function of wavelength for Mo(CO)$_6$ and Mo(CO)4(1,4-N,N'-di-tert-butyldiazabutadiene), in accordance with one or more embodiments of the present invention.

In another aspect, the photo-activation of metal precursors can be modeled by using density functional theory (DFT) calculations. For example, the bond dissociation energies of ligands in $Mo(CO)_6$ and $Mo(CO)_4$(1,4-N,N'-di-tertbutyldiazabutadiene) have been calculated, as shown in plot 500A of FIG. 5A. The bond dissociation energies for these ligands indicate that the Mo-ligand bond strength is significant, and will likely require (in the absence of photons) a high temperature ALD/CVD process, or plasma activation, to enable deposition of a pure Mo film. Modeling of the electronic states of these two precursors, however, indicate that they are photoactive and will absorb photons in the accessible UV range as is shown in plot 500B of FIG. 5B. FIG. 5B shows the DFT calculated normalized UV absorption intensity as a function of wavelength for $Mo(CO)_6$ and $Mo(CO)4$(1,4-N,N'-di-tert-butyldiazabutadiene). The data indicate that both precursors should be photo-active in the UV range. Accordingly, taking FIGS. 5A and 5B together, the representative precursors are demonstrated to be good candidates for photo-assisted ALD/CVD.

One or more embodiments described herein are directed to selective area deposition of metal films by atomic layer deposition (ALD) and/or chemical vapor deposition (CVD). To provide context, the ability to selectively deposit metal on one surface over another can enable new integration and patterning schemes as well as decrease the number of manufacturing operations otherwise associated with a semiconductor manufacturing process. In accordance with an embodiment of the present invention, as described above, a precursor class is described with built-in structural features that enable the photo-assisted ALD or CVD of metals on metallic surfaces while avoiding deposition on adjacent dielectric surfaces such as silicon dioxide ($SiO_2$) or low-k inter layer dielectric layers (ILDs). In a particular embodiment, the approaches described herein can be used to enable electroless via bottom-up fill and can also enable self-aligned bottom-up interconnect design, examples of which are described in greater detail below. As such, one or more embodiments provide approaches for selectively depositing metallic films by a photo-assisted ALD or CVD process, while avoiding undesirable metallic contamination of neighboring (low-k) dielectric layers. Such processes can be employed in self-aligned next layer interconnect patterning scheme, an example of which is described below. In addition to metal versus dielectric selectivity, metal versus metal selectivity or dielectric versus dielectric selectivity may also be achieved. It is to be appreciated that, for selectivity, in an embodiment, growing the material itself can be performed in an absorptive manner and therefore utilized to accentuate selective growth. That is, selective growth is not merely limited to nucleation.

Thus, in another aspect, one or more embodiments described herein are directed to self-aligned via and plug patterning. The self-aligned aspect of the processes described herein may be based on a directed self-assembly (DSA) mechanism, as described in greater detail below. However, it is to be understood that selective growth mechanisms may be employed in place of, or in combination with, DSA-based approaches. In an embodiment, processes described herein enable realization of self-aligned metallization using selective metal deposition for back-end of line feature fabrication.

To provide context, patterning and aligning of features at less than approximately 50 nanometer pitch requires many reticles and critical alignment strategies that are extremely expensive for a semiconductor manufacturing process. Generally, embodiments described herein involve the fabrication of metal and via patterns based on the positions of an underlying layer. That is, in contrast to conventional top-down patterning approaches, a metal interconnect process is effectively reversed and built from the previous layer up. This is in contrast to a conventional approach where an interlayer dielectric (ILD) is first deposited, with a pattern for metal and via layers subsequently patterned therein. In the conventional approach, alignment to a previous layer is performed using a lithography scanner alignment system. The ILD is then etched.

More specifically, one or more embodiments are directed to an approach that employs an underlying metal as a template to build the conductive vias and non-conductive spaces or interruptions between metals (referred to as "plugs"). Vias, by definition, are used to land on a previous layer metal pattern. In this vein, embodiments described herein enable a more robust interconnect fabrication scheme since alignment by lithography equipment is no longer relied on. Such an interconnect fabrication scheme can be used to save numerous alignment/exposures, can be used to improve electrical contact (e.g., by reducing via resistance), and can be used to reduce total process operations and processing time otherwise required for patterning such features using conventional approaches.

As illustrated below, self-aligned via and metal patterning approaches described herein may include one or more of the following aspects or attributes: (a) a bottom up super-self-aligned via/metal patterning process is enabled; (b) a previous layer metal is used to direct positions of vias on the layer formed above; (c) a process that generates every possible via and metal line end position but maintains only required or desired via and metal line end positions; (d) the position and shape of vias and metal line ends are pre-formed from a previous layer pattern; (e) an intersection of metal below and above naturally forms the fully self-aligned via positions; (f) via and plugs position, size and shape are defined by a pre-existing grating lithography from underlying metal layers; (g) via and plug lithography is required only for selecting one or another and does not affect the position, shape or size of the features (e.g., LWR is irrelevant); (h) processes described herein may be characterized as an upside down dual-damascene or via/plug first approach; (i) corresponding lithography photoresist design can be simplified since greater tolerance is achieved in the selection of via and plug locations within a layer (this may be referred to as a "bucket" approach, where a photoresist is merely used to fill a plurality of generated holes, where only certain holes are subsequently selected to be maintained or deleted); (j) LWR is not critical and faster resists can be used; (k) the size of the features can be fabricated as a single shape and size, and may be applicable for electron beam direct write (EBDW) processes; and (k) via design rules are simplified and all possible vias are allowed in any geometric configuration, where the size of the vias is completely defined by the intersection of the metal above and below.

FIGS. 6A-6L illustrate portions of integrated circuit layers representing various operations in a method of self-aligned via and metal patterning, in accordance with an embodiment of the present invention. In each illustration at each described operation, plan views are shown on the left-hand side, and corresponding cross-sectional views are shown on the right-hand side. These views will be referred to herein as corresponding cross-sectional views and plan views.

Figure 6A:
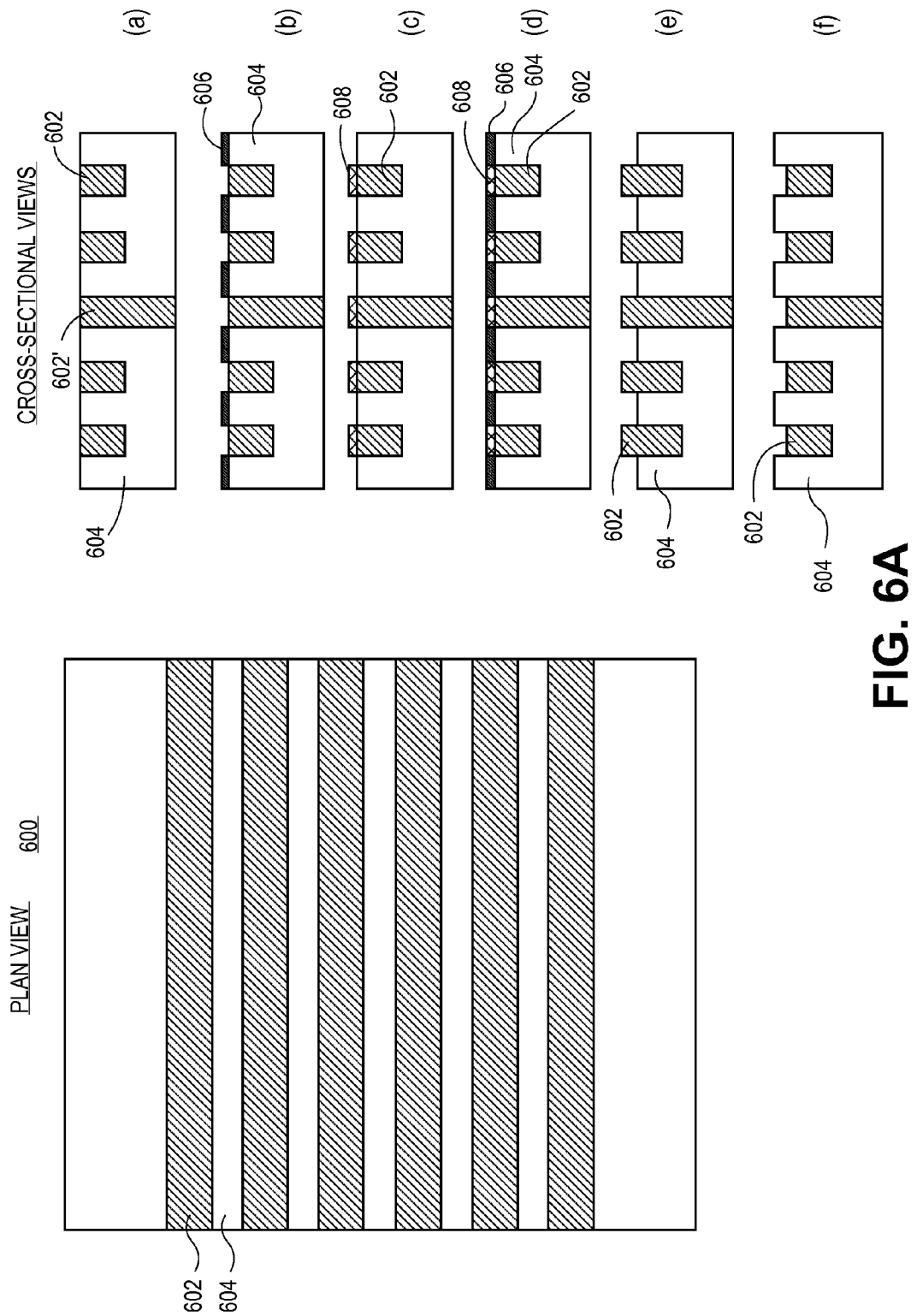

FIG. 6A illustrates a plan view and corresponding cross-sectional views of options for a previous layer metallization structure, in accordance with an embodiment of the present invention. Referring to the plan view and corresponding cross-section view option (a), a starting structure 600 includes a pattern of metal lines 602 and interlayer dielectric (ILD) lines 604. The starting structure 600 may be patterned in a grating-like pattern with metal lines spaced at a constant pitch and having a constant width (e.g., for a DSA embodiment, but not necessarily needed for a directed selective growth embodiment), as is depicted in FIG. 6A. The pattern, for example, may be fabricated by a pitch halving or pitch quartering approach. Some of the lines may be associated with underlying vias, such as line 602' shown as an example in the cross-sectional views.

Referring again to FIG. 6A, alternative options (b)-(f) address situations where an additional film is formed (e.g., deposited, grown, or left as an artifact remaining from a previous patterning process) on a surface of one of, or both of, the metal lines 602 and interlayer dielectric lines 604. In example (b), an additional film 606 is disposed on the interlayer dielectric lines 604. In example, (c), an additional film 608 is disposed on the metal lines 602. In example, (d) an additional film 606 is disposed on the interlayer dielectric lines 604, and an additional film 608 is disposed on the metal lines 602. Furthermore, although the metal lines 602 and the interlayer dielectric lines 604 are depicted as co-planar in (a), in other embodiments, they are not co-planar. For example, in (e), the metal lines 602 protrude above the interlayer dielectric lines 604. In example, (f), the metal lines 602 are recessed below the interlayer dielectric lines 604.

Referring again to examples (b)-(d), an additional layer (e.g., layer 606 or 608) can be used as a hardmask (HM) or protection layer or be used to enable a selective growth and/or self-assembly described below in association with subsequent processing operations. Such additional layers may also be used to protect the ILD lines from further processing. In addition, selectively depositing another material over the metal lines may be beneficial for similar reasons. Referring again to examples (e) and (f), it may also be possible to recess either the ILD lines or the metal lines with any combination of protective/HM materials on either or both surfaces. Overall, there exist numerous options at this stage for preparing ultimately underlying surfaces for a selective or directed self-assembly process.

In an embodiment, as used throughout the present description, interlayer dielectric (ILD) material, such as the material of the interlayer dielectric lines 604, is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material, such as the material of metal lines 602, is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect. As will be described further below, top surfaces of the lower interconnect lines may be used for self-aligned via and plug formation.

In an embodiment, as is also used throughout the present description, hardmask materials, such, as layers 606 or 608 if included as a hardmask, are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

It is to be understood that the layers and materials described in association with FIG. 6A are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 6A may be fabricated on underlying lower level interconnect layers.

Figure 6B:
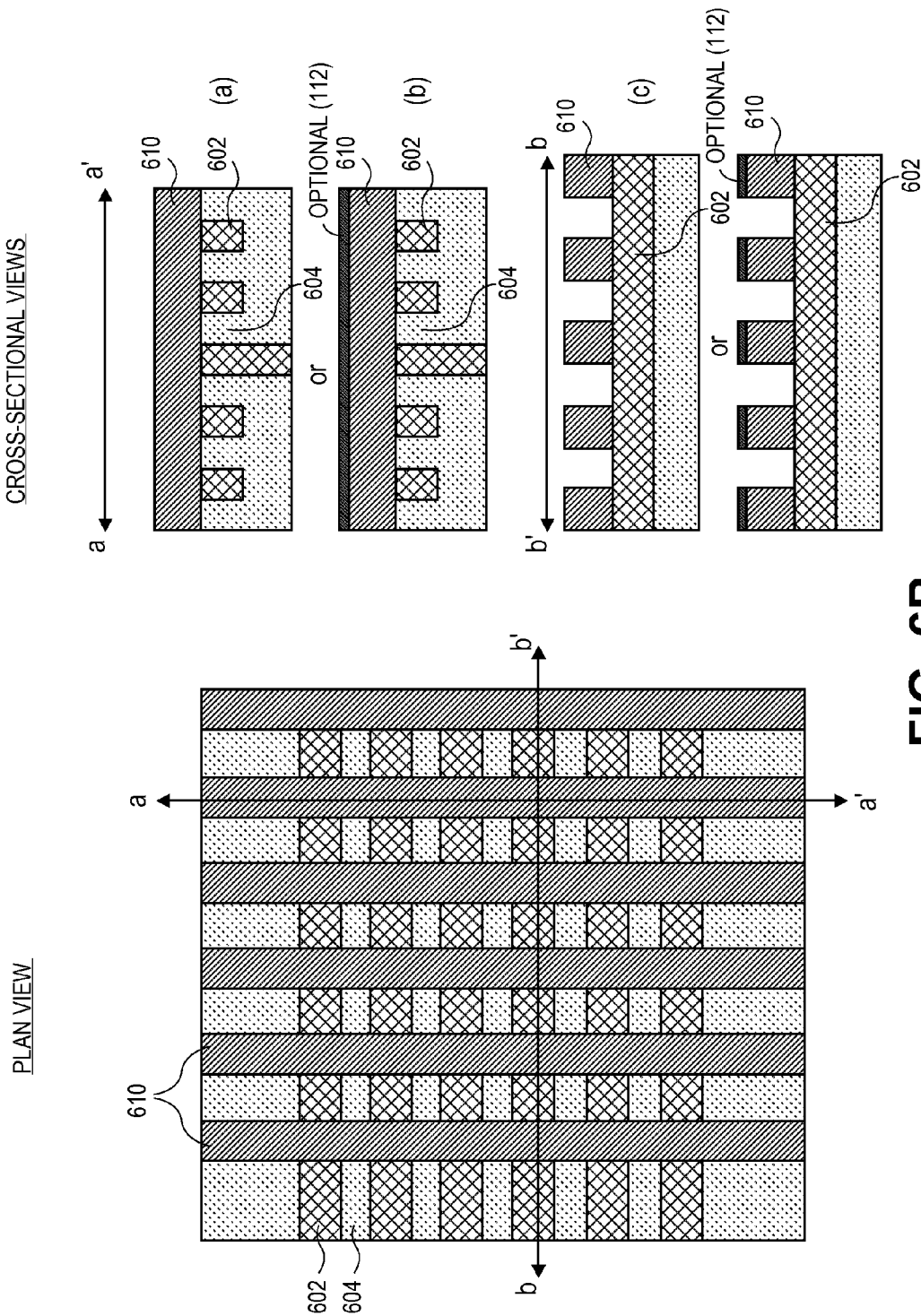

FIG. 6B illustrates a plan view and corresponding cross-sectional views of the structure of FIG. 6A following formation of interlayer dielectric (ILD) lines 610 above the structure of FIG. 6A, in accordance with an embodiment of the present invention. Referring to the plan view and corresponding cross-sectional views (a) and (c) taken along axes a-a' and c-c', respectively, the ILD lines 610 are formed in a grating structure perpendicular to the direction of underlying lines 604. In an embodiment, a blanket film of the material of lines 610 is deposited by chemical vapor deposition or like techniques. In an embodiment, the blanket film is then patterned using lithography and etch processing which may involve, e.g., spacer-based-quadruple-patterning (SBQP) or pitch quartering. It is to be understood that the grating pattern of lines 610 can be fabricated by numerous methods, including EUV and/or EBDW lithography, directed self-assembly, etc. As will be described in greater detail below, subsequent metal layer will thus be patterned in the orthogonal direction relative to the previous metal layer since the grating of lines 610 is orthogonal to the direction of the underlying structure. In one embodiment, a single 193 nm lithography mask is used with alignment/registration to the previous metal layer 602 (e.g., grating of lines 610 aligns to the previous layer 'plug' pattern in X and to the previous metal grating in Y). Referring to cross-sectional structures (b) and (d), a hardmask 612 may be formed on, or retained following pattering of, dielectric lines 610. The hardmask 612 can be used to protect lines 610 during subsequent patterning steps. As described in greater detail below, the formation of lines 610 in a grating pattern exposes regions of the previous metal lines 602 and previous ILD lines 604 (or corresponding hardmask layers on 602/604). The exposed regions correspond to all possible future via locations where metal is exposed. In one embodiment, the previous layer metal layer (e.g., lines 602) is protected, labeled, brushed, etc. at this point in the process flow.

Figure 6C:
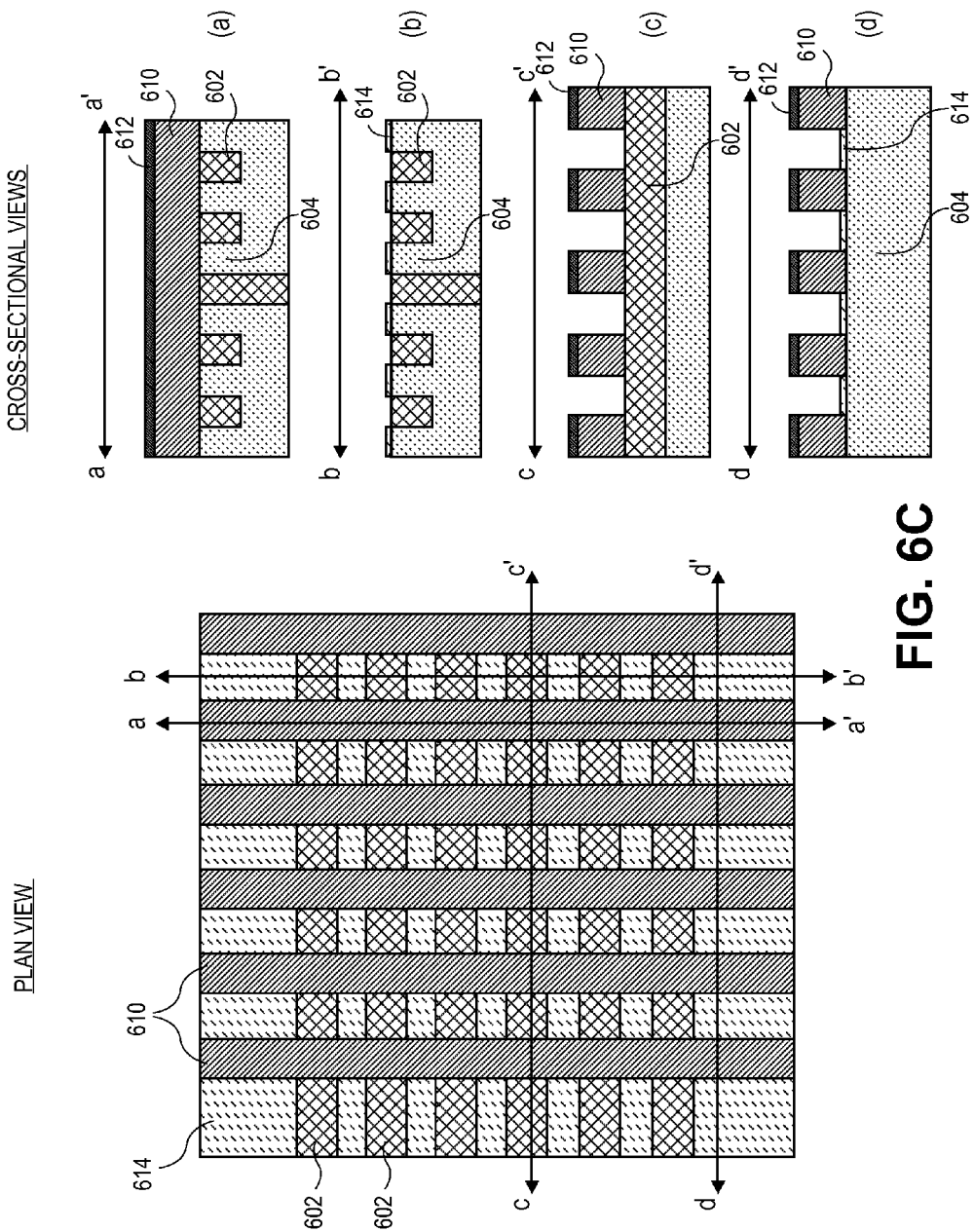

FIG. 6C illustrates a plan view and corresponding cross-sectional views of the structure of Figure B following selective differentiation all of the potential via locations from all of the plug locations, in accordance with an embodiment of the present invention. Referring to the plan view and corresponding cross-sectional views (a)-(d) taken along axes, a-a', b-b', c-c' and d-d', respectively, following formation of ILD lines 610, a surface modification layer 614 is formed on exposed regions of the underlying ILD lines 604. In an embodiment, surface modification layer 614 is a dielectric layer. In an embodiment, surface modification layer 614 is formed by a selective bottom-up growth approach. In one such embodiment, the bottom-up growth approach involves a directed self-assembly (DSA) brush coat that has one polymer component which assembles preferentially on the underlying ILD lines 604 or, alternatively, on the metal lines 602 (or on a sacrificial layer deposited or grown on the underlying metal or ILD material).

FIG. 6D1 illustrates a plan view and corresponding cross-sectional views of the structure of FIG. 6C following differential polymer addition to the exposed portions of underlying metal and ILD lines of FIG. 6C, in accordance with an embodiment of the present invention. Referring to the plan view and corresponding cross-sectional views (a)-(d) taken along axes, a-a', b-b', c-c' and d-d', respectively, directed self-assembly (DSA) or selective growth on exposed portions of the underlying metal/ILD 602/604 grating is used to form intervening lines 616 with alternating polymers or alternating polymer components in between the ILD lines 610. For example, as shown, polymer 616A (or polymer component 616A) is formed on or above the exposed portions of interlayer dielectric (ILD) lines 604 of FIG. 6C, while polymer 616B (or polymer component 616B) is formed on or above the exposed portions of the metal lines 602 of FIG. 6C. Although polymer 616A is formed on or above the surface modification layer 614 described in association with FIG. 6C (see cross-sectional views (b) and (d) of FIG. 6D1), it is to be understood that, in other embodiments, the surface modification layer 614 can be omitted and the alternating polymers or alternating polymer components can instead be formed directly in the structure described in association with FIG. 6B.

Referring again to FIG. 6D1, in an embodiment, once the surface of the underlying structure (e.g., structure 600 of FIG. 6A) has been prepared (e.g., such as the structure of FIG. 6B or the structure of FIG. 6C) or is used directly, a 50-50 diblock copolymer, such as polystyrene-polymethyl methacrylate (PS-PMMA), is coated on the substrate and annealed to drive self assembly, leading to the polymer 616A/polymer 616B layer 616 of FIG. 6D1. In one such embodiment, with appropriate surface energy conditions, the block copolymers segregate based on the underlying material exposed between ILD lines 610. For example, in a specific embodiment, polystyrene aligns selectively to the exposed portions of underlying metal lines 602 (or corresponding metal line cap or hardmask material). Meanwhile, the polymethyl methacrylate aligns selectively to the exposed portions of ILD lines 604 (or corresponding metal line cap or hardmask material).

Thus, in an embodiment, the underlying metal and ILD grid, as exposed between ILD lines 610 is recreated in the block co-polymer (BCP, i.e., polymer 616A/polymer 616B). This can particularly be so if the BCP pitch is commensurate with the underlying grating pitch. The polymer grid (polymer 616A/polymer 616B) is, in one embodiment, robust against certain small deviations from a perfect grid. For example, if small plugs effectively place an oxide or like material where a perfect grid would have metal, a perfect polymer 616A/polymer 616B grid can still be achieved. However, since the ILD lines grating is, in one embodiment, an idealized grating structure, with no metal disruptions of the ILD backbone, it may be necessary to render the ILD surface neutral since both types of polymer (616A and 616B) will, in such an instance, be exposed to ILD like material while only one type is exposed to metal.

In an embodiment, the thickness of the coated polymer (polymer 616A/polymer 616B) is approximately the same as, or slightly thicker than, the ultimate thickness of an ILD ultimately formed in its place. In an embodiment, as described in greater detail below, the polymer grid is formed not as an etch resist, but rather as scaffolding for ultimately growing a permanent ILD layer there around. As such, the thickness of the polymer 616 (polymer 616A/polymer 616B) can be important since it may be used to define the ultimate thickness of a subsequently formed permanent ILD layer. That is, in one embodiment, the polymer grating shown in FIG. 6D1 is eventually replaced with an ILD grating of roughly the same thickness.

In an embodiment, as mentioned above, the grid of polymer 616A/polymer 616B of FIG. 6D1 is a block copolymer. In one such embodiment, the block copolymer molecule is a polymeric molecule formed of a chain of covalently bonded monomers. In a block copolymer, there are at least two different types of monomers, and these different types of monomers are primarily included within different blocks or contiguous sequences of monomers. The illustrated block copolymer molecule includes a block of polymer 616A and a block of polymer 616B. In an embodiment, the block of polymer 616A includes predominantly a chain of covalently linked monomer A (e.g., A-A-A-A-A . . . ), whereas the block of polymer 616B includes predominantly a chain of covalently linked monomer B (e.g., B-B-B-B-B . . . ). The monomers A and B may represent any of the different types of monomers used in block copolymers known in the arts. By way of example, the monomer A may represent monomers to form polystyrene, and the monomer B may represent monomers to form poly(methyl methacrylate) (PMMA), although the scope of the invention is not so limited. In other embodiments, there may be more than two blocks. Moreover, in other embodiments, each of the blocks may include different types of monomers (e.g., each block may itself be a copolymer). In one embodiment, the block of polymer 616A and the block of polymer 616B are covalently bonded together. The block of polymer 616A and the block of polymer 616B may be of approximately equal length, or one block may be significantly longer than the other.

Typically, the blocks of block copolymers (e.g., the block of polymer 616A and the block of polymer 616B) may each have different chemical properties. As one example, one of the blocks may be relatively more hydrophobic (e.g., water repelling) and the other may be relatively more hydrophilic (water attracting). At least conceptually, one of the blocks may be relatively more similar to oil and the other block may be relatively more similar to water. Such differences in chemical properties between the different blocks of polymers, whether a hydrophilic-hydrophobic difference or otherwise, may cause the block copolymer molecules to self-assemble. For example, the self-assembly may be based on microphase separation of the polymer blocks. Conceptually, this may be similar to the phase separation of oil and water which are generally immiscible. Similarly, differences in hydrophilicity between the polymer blocks (e.g., one block is relatively hydrophobic and the other block is relatively hydrophilic), may cause a roughly analogous microphase separation where the different polymer blocks try to "separate" from each other due to chemical dislike for the other.

However, in an embodiment, since the polymer blocks are covalently bonded to one another, they cannot completely separate on a macroscopic scale. Rather, polymer blocks of a given type may tend to segregate or conglomerate with polymer blocks of the same type of other molecules in extremely small (e.g., nano-sized) regions or phases. The particular size and shape of the regions or microphases generally depends at least in part upon the relative lengths of the polymer blocks. In an embodiment, by way of example (as shown in FIG. 6D1), in two block copolymers, if the blocks are approximately the same length, a grid like pattern of alternating polymer 616A lines and polymer 616B lines is generated. In another embodiment (not shown), in two block copolymers, if one of the blocks is longer than the other, but not too much longer than the other, columnar structures may formed. In the columnar structures, the block copolymer molecules may align with their shorter polymer blocks microphase separated into the interior of the columns and their longer polymer blocks extending away from the columns and surrounding the columns. For example, if the block of polymer 616A were longer than the block of polymer 616B, but not too much longer, columnar structures may formed in which many block copolymer molecules align with their shorter blocks of polymer 616B forming columnar structures surrounded by a phase having the longer blocks of polymer 616A. When this occurs in an area of sufficient size, a two-dimensional array of generally hexagonally-packed columnar structures may be formed.

In an embodiment, the polymer 616A/polymer 616B grating is first applied as an unassembled block copolymer layer portion that includes a block copolymer material applied, e.g., by brush or other coating process. The unassembled aspect refers to scenarios where, at the time of deposition, the block copolymer has not yet substantially phase separated and/or self-assembled to form nanostructures. In this unassembled form, the block polymer molecules are relatively highly randomized, with the different polymer blocks relatively highly randomly oriented and located, which is in contrast to the assembled block copolymer layer portion discussed in association with the resulting structure of FIG. 6D1. The unassembled block copolymer layer portion may be applied in a variety of different ways. By way of example, the block copolymer may be dissolved in a solvent and then spin coated over the surface. Alternatively, the unassembled block copolymer may be spray coated, dip coated, immersion coated, or otherwise coated or applied over the surface. Other ways of applying block copolymers, as well as other ways known in the arts for applying similar organic coatings, may potentially be used. Then, the unassembled layer may form an assembled block copolymer layer portion, e.g., by microphase separation and/or self-assembly of the unassembled block copolymer layer portion. The microphase separation and/or self-assembly occurs through rearrangement and/or repositioning of the block copolymer molecules, and in particular to rearrangement and/or repositioning of the different polymer blocks of the block copolymer molecules.

In one such embodiment, an annealing treatment may be applied to the unassembled block copolymer in order to initiate, accelerate, increase the quality of, or otherwise promote microphase separation and/or self-assembly. In some embodiments, the annealing treatment may include a treatment that is operable to increase a temperature of the block copolymer. One example of such a treatment is baking the layer, heating the layer in an oven or under a thermal lamp, applying infrared radiation to the layer, or otherwise applying heat to or increasing the temperature of the layer. The desired temperature increase will generally be sufficient to significantly accelerate the rate of microphase separation and/or self-assembly of the block polymer without damaging the block copolymer or any other important materials or structures of the integrated circuit substrate. Commonly, the heating may range between about 50° C. to about 300° C., or between about 75° C. to about 250° C., but not exceeding thermal degradation limits of the block copolymer or integrated circuit substrate. The heating or annealing may help to provide energy to the block copolymer molecules to make them more mobile/flexible in order to increase the rate of the microphase separation and/or improve the quality of the microphase separation. Such microphase separation or rearrangement/repositioning of the block copolymer molecules may lead to self-assembly to form extremely small (e.g., nano-scale) structures. The self-assembly may occur under the influence of surface energy, molecular affinities, and other surface-related and chemical-related forces.

In any case, in some embodiments, self-assembly of block copolymers, whether based on hydrophobic-hydrophilic differences or otherwise, may be used to form extremely small periodic structures (e.g., precisely spaced nano-scale structures or lines). In some embodiments, they may be used to form nano-scale lines or other nano-scale structures that can ultimately be used to form via and openings. In some embodiments, directed self assembly of block copolymers may be used to form vias that are self aligned with interconnects, as described in greater detail below.

Referring again to FIG. 6D1, in an embodiment, for a DSA process, in addition to direction from the underlying ILD/metal 604/602 surfaces the growth process can be affected by the sidewalls of the material of ILD lines 610. As such, in one embodiment, DSA is controlled through graphoepitaxy (from the sidewalls of lines 610) and chemoepitaxy (from the underlying exposed surface characteristics). Constraining the DSA process both physically and chemically can significantly aid the process from a defectivity standpoint. The resulting polymers 616A/616B have fewer degrees of freedom and are fully constrained in all directions through chemical (e.g., underlying ILD or metal lines, or surface modifications made thereto by, for example, a brush approach) and physical (e.g., from the trenches formed between the ILD lines 610).

In an alternative embodiment, a selective growth process is used in place of a DSA approach. FIG. 6D2 illustrates a cross-sectional view of the structure of FIG. 6B following selective material deposition on the exposed portions of underlying metal and ILD lines, in accordance with another embodiment of the present invention. Referring to FIG. 6D2, a first material type 800 is grown above exposed portions of underlying ILD lines 604. A second, different, material type 802 is grown above exposed portions of underlying metal lines 602. In an embodiment, the selective growth is achieved by a dep-etch-dep-etch approach for each of the first and second materials, resulting in a plurality of layers of each of the materials, as depicted in FIG. 6D2. Such an approach may be favorable versus conventional selective growth techniques which can form "mushroom-top" shaped films. The mushroom topping film growth tendency can be reduced through an alternating deposition/etch/deposition (dep-etch-dep-etch) approach. In another embodiment, a film is deposited selectively over the metal followed by a different film selectively over the ILD (or vice versa) and repeated numerous times creating a sandwich-like stack. In another embodiment, both materials are grown simultaneously in a reaction chamber (e.g., by a CVD style process) that grows selectively on each exposed region of the underlying substrate.

Figure 6E:
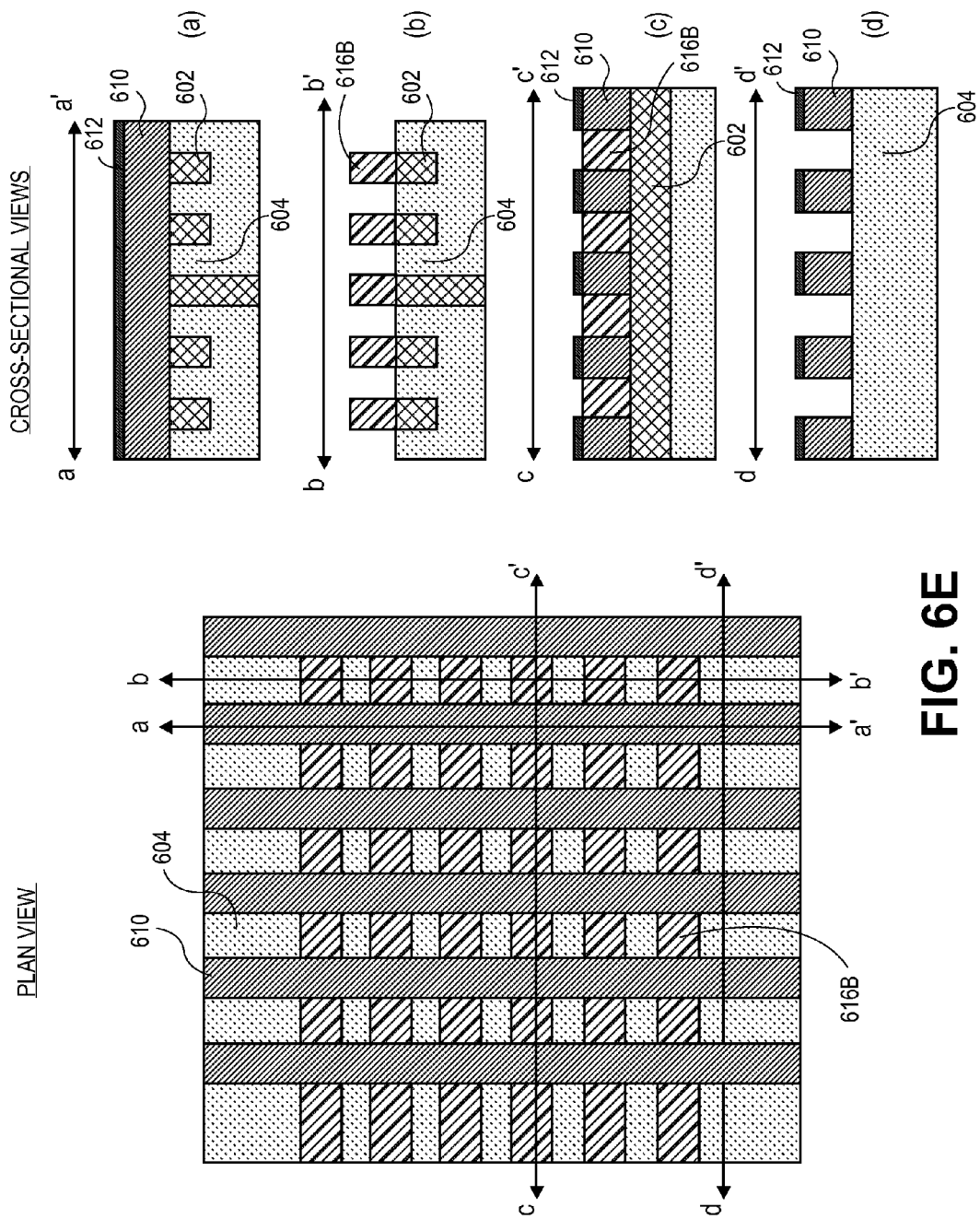

FIG. 6E illustrates a plan view and corresponding cross-sectional views of the structure of FIG. 6D 1 following removal of one species of polymer, in accordance with an embodiment of the present invention. Referring to the plan view and corresponding cross-sectional views (a)-(d) taken along axes, a-a', b-b', c-c' and d-d', respectively, polymer or polymer portion 616A is removed to re-expose the ILD lines 604 (or hardmask or cap layers formed on the ILD lines 604), while polymer or polymer portion 616B is retained above the metal lines 602. In an embodiment, a deep ultra-violet (DUV) flood expose followed by a wet etch or a selective dry etch is used to selectively remove polymer 616A. It is to be understood that, instead of first removal of the polymer from the ILD lines 604 (as depicted), removal from the metal lines 602 may instead be first performed. Alternatively, a dielectric film is selectively grown over the region, and a mixed scaffolding is not used.

Figure 6F:
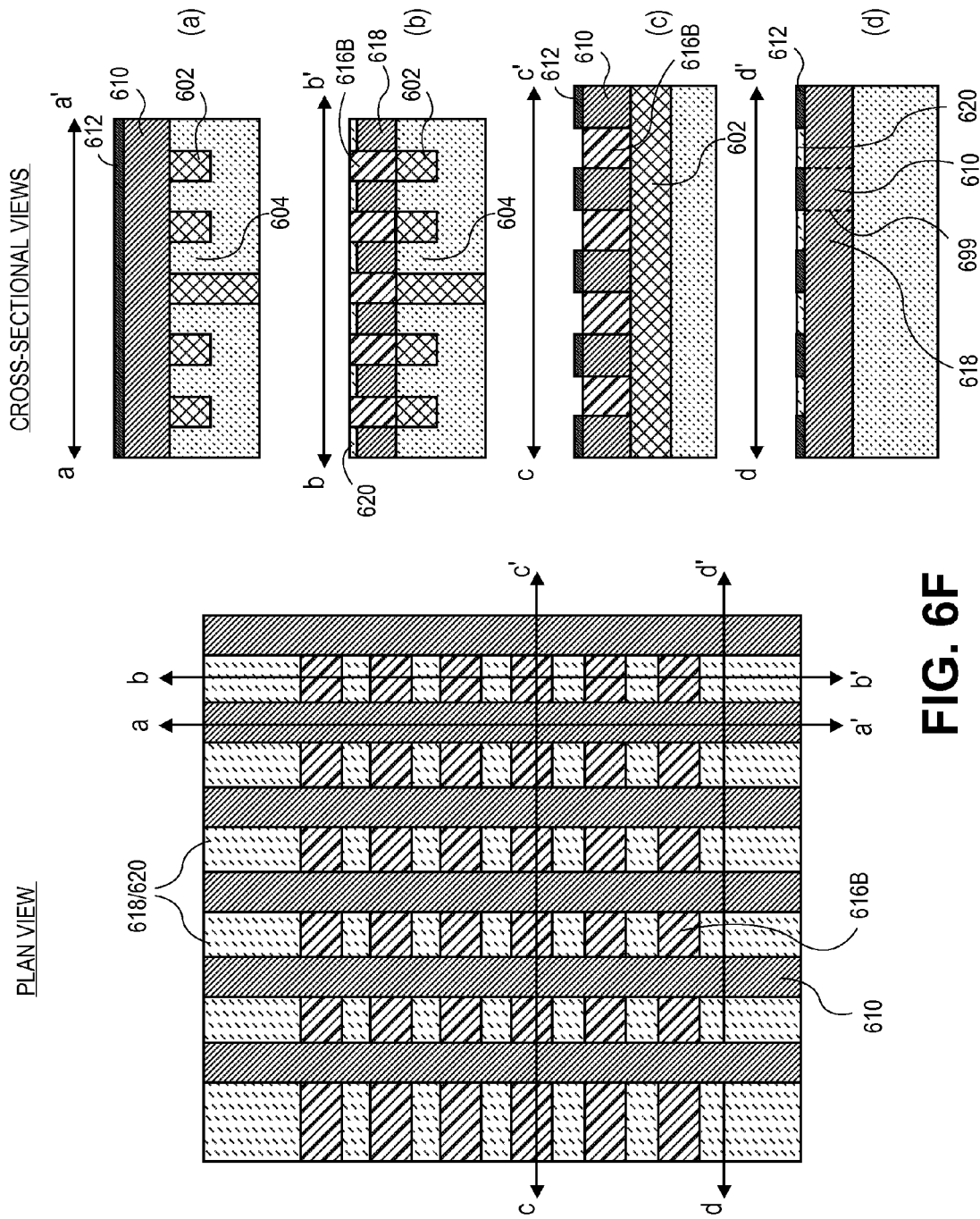

FIG. 6F illustrates a plan view and corresponding cross-sectional views of the structure of FIG. 6E following formation of an ILD material in the locations opened upon removal of the one species of polymer, in accordance with an embodiment of the present invention. Referring to the plan view and corresponding cross-sectional views (a)-(d) taken along axes, a-a', b-b', c-c' and d-d', respectively, the exposed regions of underlying ILD lines 604 are filled with a permanent interlayer dielectric (ILD) layer 618. As such, the open spaces between all possible via positions are filled with an ILD layer 618 includes a hardmask layer 620 disposed thereon, as depicted in the plan view and in the cross-sectional views (b) and (d) of FIG. 6F. It is to be understood that the material of ILD layer 618 need not be the same material as ILD lines 610. In an embodiment, the ILD layer 618 is formed by a deposition and polish process. In the case where ILD layer 618 is formed with an accompanying hardmask layer 620, a special ILD fill material may be used (e.g., polymer encapsulated nanoparticles of ILD that fills holes/trenches). In such a case, a polish operation may not be necessary.

Referring again to FIG. 6F, in an embodiment, the resulting structure includes a uniform ILD structure (ILD lines 610+ILD layer 618), and the locations of all possible plugs are covered in hardmask 620 and all possible vias are in areas of polymer 616B. In one such embodiment, ILD lines 610 and ILD layer 618 are composed of a same material. In another such embodiment, ILD lines 610 and ILD layer 618 are composed of different ILD materials. In either case, in a specific embodiment, a distinction such as a seam between the materials of ILD lines 610 and ILD layer 618 may be observed in the final structure. Exemplary seams 699 are shown in FIG. 6F for illustrative purposes.

Figure 6G:
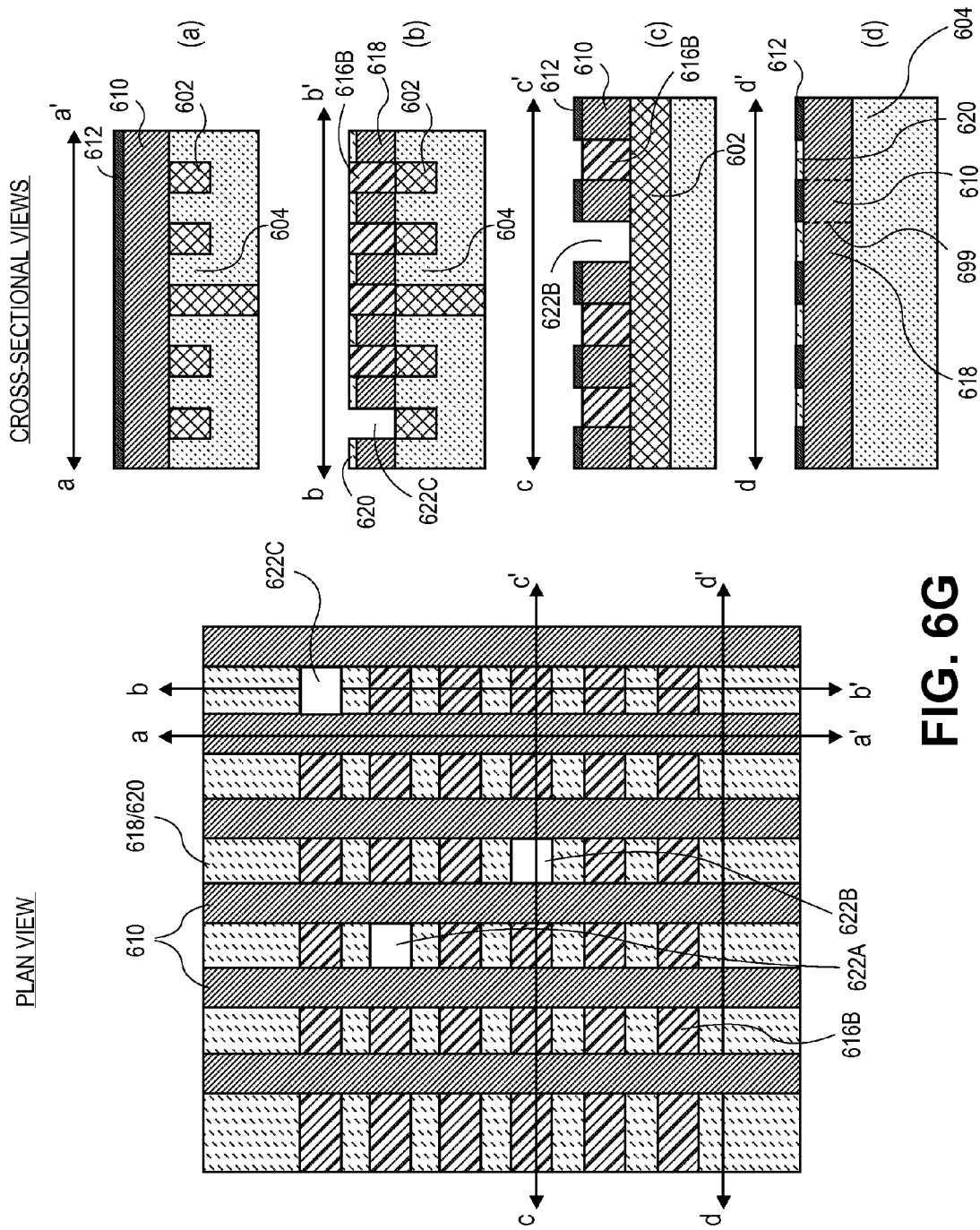

FIG. 6G illustrates a plan view and corresponding cross-sectional views of the structure of FIG. 6F following via patterning, in accordance with an embodiment of the present invention. Referring to the plan view and corresponding cross-sectional views (a)-(d) taken along axes, a-a', b-b', c-c' and d-d', respectively, via locations 622A, 622B and 622C are opened by removal of polymer 616B in select locations. In an embodiment, selective via location formation is accomplished by using a lithographic technique. In one such embodiment, polymer 616B is globally removed with an ash and refilled with photoresist. The photoresist may be highly sensitive and have a large acid diffusion and aggressive deprotection or crosslinking (depending on resist tone) because the latent image is confined in both directions by ILD (e.g., by ILD lines 610 and ILD layer 618). The resist serves as a digital switch to turn "on" or "off" depending whether a via is required in a particular location or not. Ideally, the photoresist can be used to fill the holes only, without spilling over. In an embodiment, the via locations 622A, 622B and 622C are fully confined with the process such that line edge or width roughness (LWR) and line collapse and/or reflection is mitigated if not eliminated. In an embodiment, low doses are used with EUV/EBDW and increase runrate significantly. In one embodiment, an additional advantage with the use of EBDW is that only a single shot type/size that can increase runrate by significantly reducing the number of apertures required as well as lowering the dose that needs to be delivered. In a case that 193 nm immersion lithography is used, in an embodiment, the process flow confines the via locations in both directions such the size of the via that actually is patterned is twice the size of the actual via on the wafer (e.g., assuming 1:1 line/space patterns). Alternatively, the via locations can be selected in the reverse tone where the vias that need to be retained are protected with photoresist and the remaining sites are removed and later filled with ILD. Such an approach can allow a single metal fill/polish process at the end of the patterning flow rather than two separate metal deposition steps.

Figure 6H:
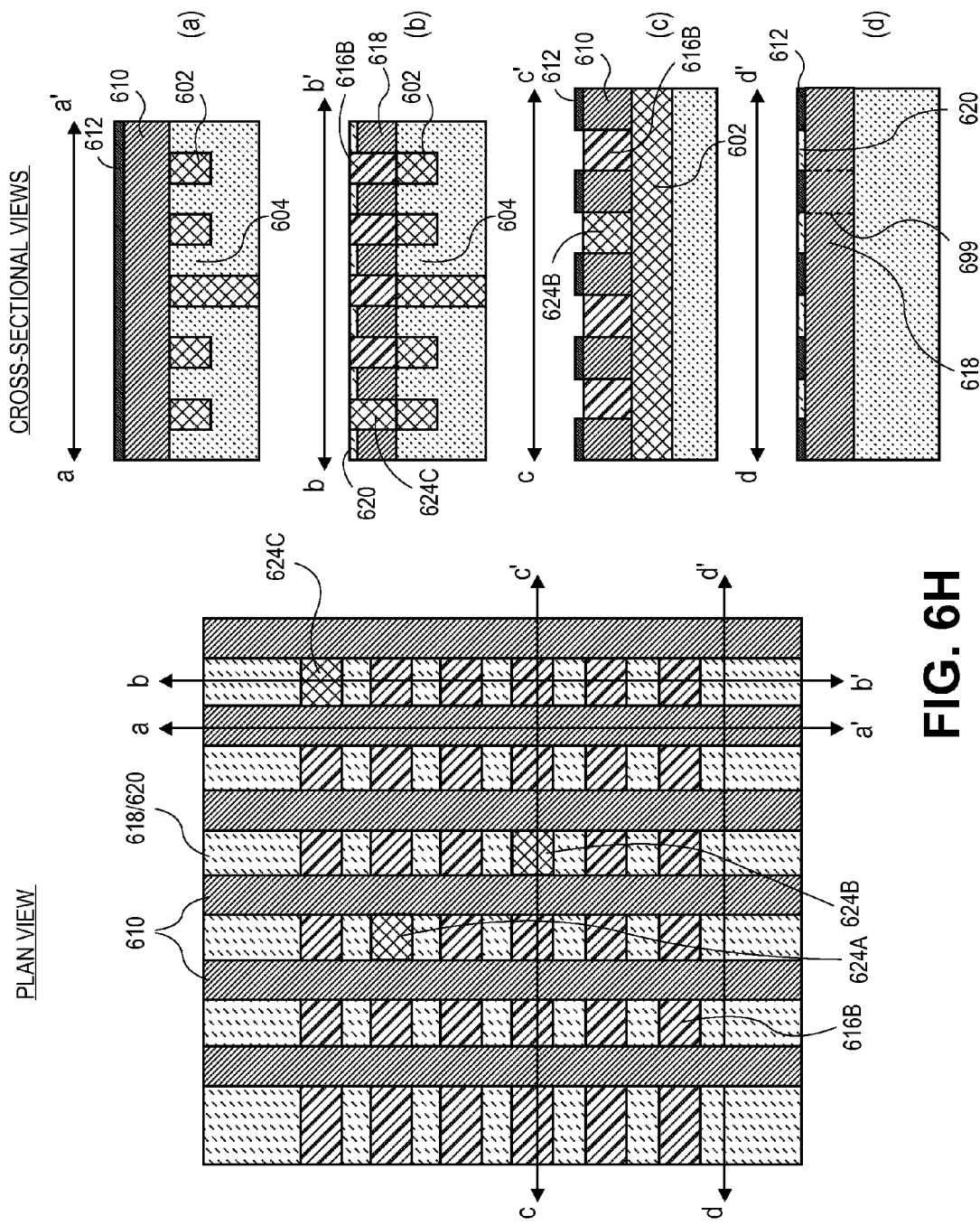

FIG. 6H illustrates a plan view and corresponding cross-sectional views of the structure of FIG. 6G following via formation using a photo-assisted, selective metal deposition process (such as described above in association with FIGS. 1-4, 5A and 5B), in accordance with an embodiment of the present invention. Referring to the plan view and corresponding cross-sectional views (a)-(d) taken along axes, a-a', b-b', c-c' and d-d', respectively, via locations 622A, 622B and 622C are filled with metal to form vias 624A, 624B and 624C, respectively. In an embodiment, via locations 622A, 622B and 622C are filled (or at least seeded) using a photo-assisted selective metal deposition process. In one such embodiment, a photo-assisted metal ALD/CVD process is used to deposit metal in via locations 622A, 622B and 622C selectively against all other exposed dielectric materials. As such, in accordance with an embodiment of the present invention, via locations 622A, 622B and 622C are filled without using a conventional metal over-fill and polishing process.

Figure 6I:
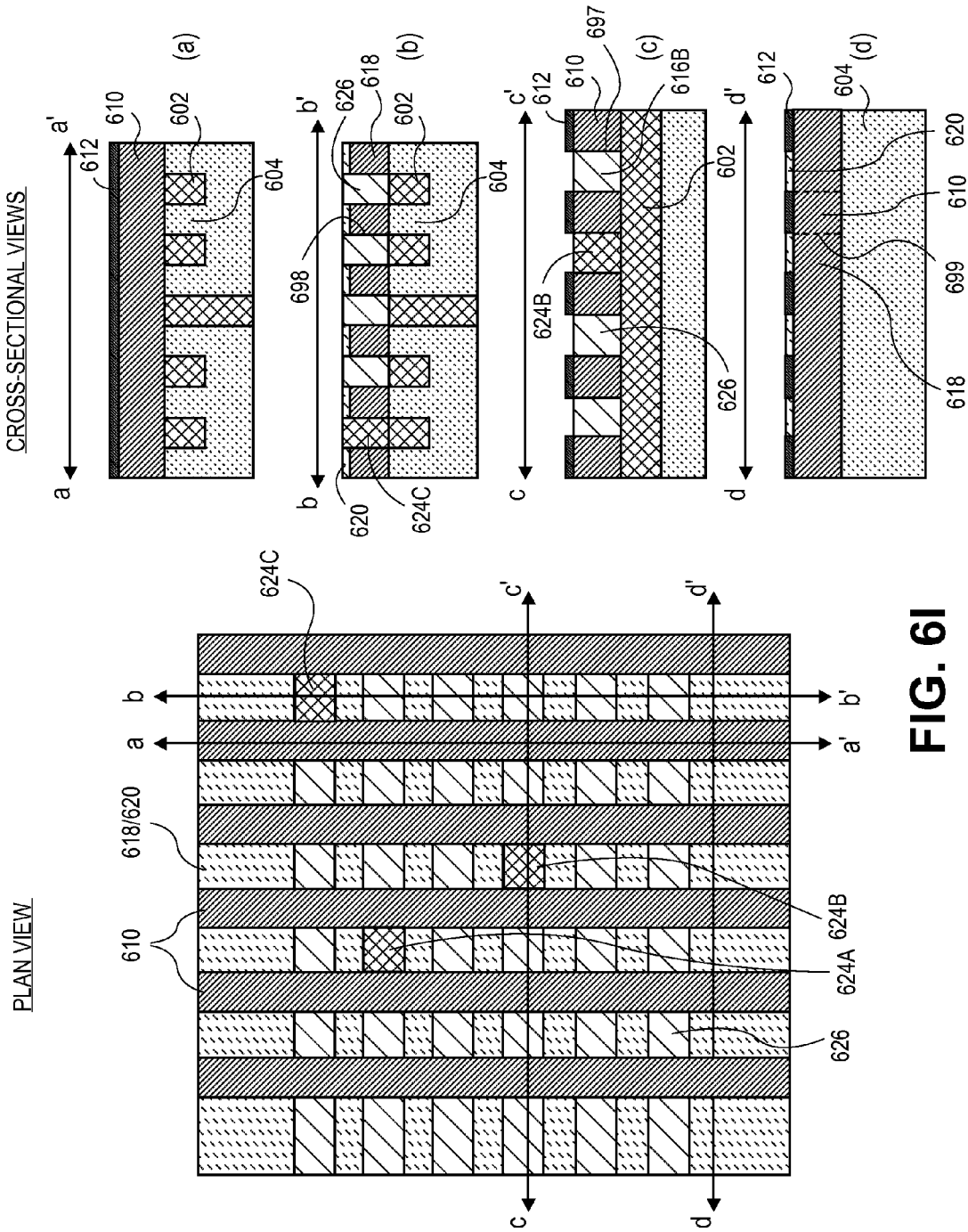

FIG. 6I illustrates a plan view and corresponding cross-sectional views of the structure of FIG. 6H following removal of the second species of polymer and replacement with an ILD material, in accordance with an embodiment of the present invention. Referring to the plan view and corresponding cross-sectional views (a)-(d) taken along axes, a-a', b-b', c-c' and d-d', respectively, remaining polymer or polymer portion 616B (e.g., where vias locations have not been selected) is removed to re-expose the metal lines 602. Subsequently, an ILD layer 626 is formed in the locations where the remaining polymer or polymer portion 616B was removed, as depicted in FIG. 6I.

Referring again to FIG. 6I, in an embodiment, the resulting structure includes a uniform ILD structure (ILD lines 610+ILD layer 618+ILD layer 626), and the locations of all possible plugs are covered in hardmask 620. In one such embodiment, ILD lines 610, ILD layer 618 and ILD layer 626 are composed of a same material. In another such embodiment, two of ILD lines 610, ILD layer 618 and ILD layer 626 are composed of a same material and the third is composed of a different ILD material. In yet another such embodiment, all of ILD lines 610, ILD layer 618 and ILD layer 626 are composed of a different ILD material with respect to one another. In any case, in a specific embodiment, a distinction such as a seam between the materials of ILD lines 610 and ILD layer 626 may be observed in the final structure. Exemplary seams 697 are shown in FIG. 6I for illustrative purposes. Likewise, a distinction such as a seam between the materials of ILD layer 618 and ILD layer

626 may be observed in the final structure. Exemplary seams 698 are shown in FIG. 6I for illustrative purposes.

Figure 6J:
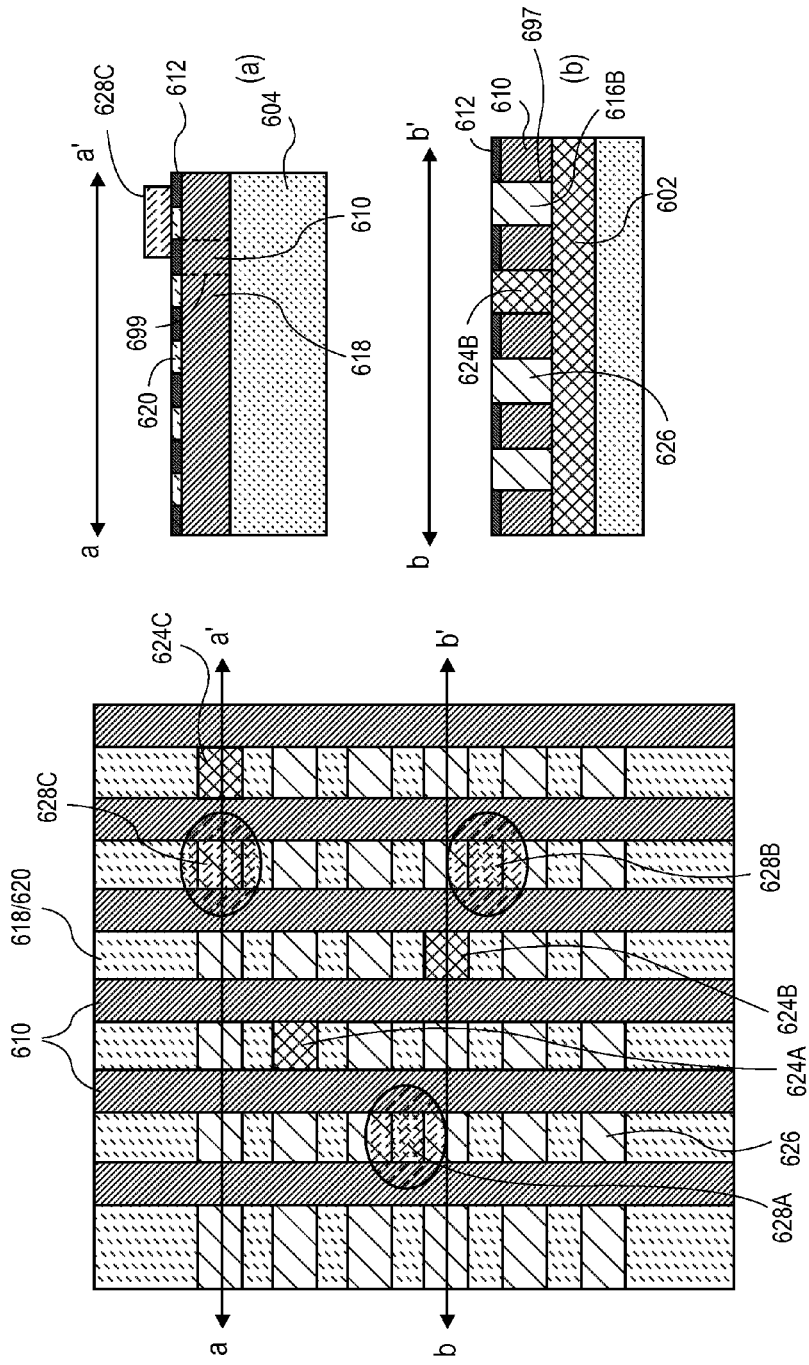

FIG. 6J illustrates a plan view and corresponding cross-sectional views of the structure of FIG. 6I following patterning of a resist or mask in selected plug locations, in accordance with an embodiment of the present invention. Referring to the plan view and corresponding cross-sectional views (a) and (b) taken along axes, a-a' and b-b', respectively, plug positions 628A, 628B and 628C are preserved by forming a mask or resist layer over those locations. Such preservation patterning may be referred to as metal end-to-end lithographic patterning, wherein plug positions are determined where breaks in subsequently formed metal lines are required. It is to be understood that since the plug locations can only be in those locations where ILD layer 618/hardmask 620 are positioned, plugs can occur over the previous layer ILD lines 604. In an embodiment, the patterning is achieved by using a lithography operation (e.g., EUV, EBDW or immersion 193 nm). In an embodiment, the process illustrated in FIG. 6J, demonstrates use of a positive tone patterning process where the regions where spaces between metal need to occur are preserved. It is to be understood that, in another embodiment, it is also possible to open holes instead and reverse the tone of the process.

Figure 6K:
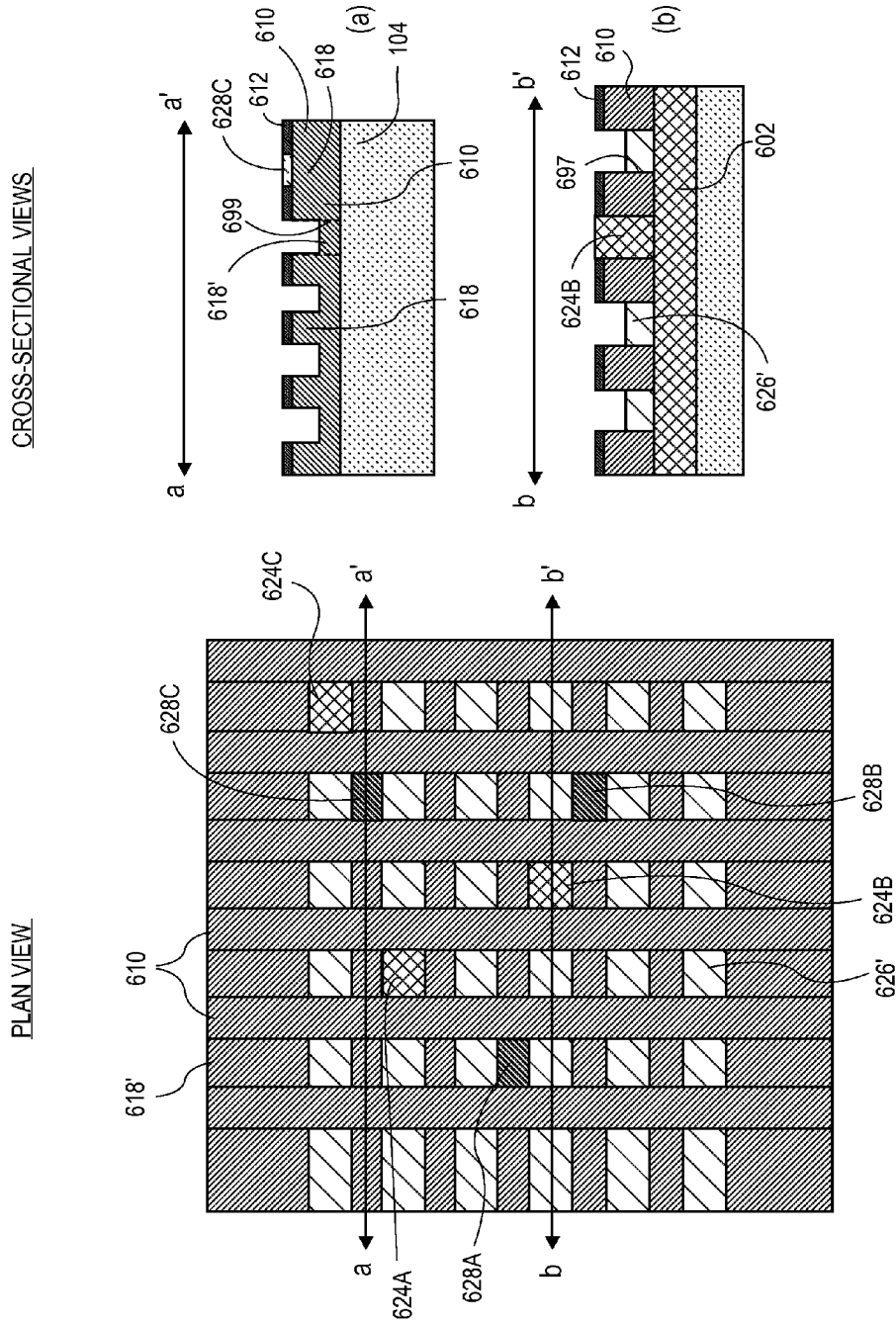

FIG. 6K illustrates a plan view and corresponding cross-sectional views of the structure of FIG. 6J following hardmask removal and ILD layer recessing, in accordance with an embodiment of the present invention. Referring to the plan view and corresponding cross-sectional views (a) and (b) taken along axes, a-a' and b-b', respectively, hardmask 620 is removed and ILD layer 618 and ILD layer 626 are recessed to form recessed ILD layer 618' and recessed ILD layer 626', respectively, by etching of these layers below their original uppermost surfaces. It is to be understood that the recessing of ILD layer 618 and ILD layer 626 is performed without etching or recessing ILD lines 610. The selectivity may be achieved by use of a hardmask layer 612 on the ILD lines (as depicted in cross-sectional views (a) and (b)). Alternatively, in a case that the ILD lines 610 are composed of an ILD material different from the material of ILD layer 618 and ILD layer 626, a selective etch may be used even in the absence of a hardmask 612. The recessing of ILD layer 618 and ILD layer 626 is to provide locations for the second level of metal lines, as isolated by ILD lines 610, as described below. The extent or depth of the recess is, in one embodiment, selected based on the desired ultimate thickness of the metal lines formed thereon. It is to be understood that the ILD layer 618 in the plug locations 628A, 628B and 628C is not recessed.

Figure 6L:
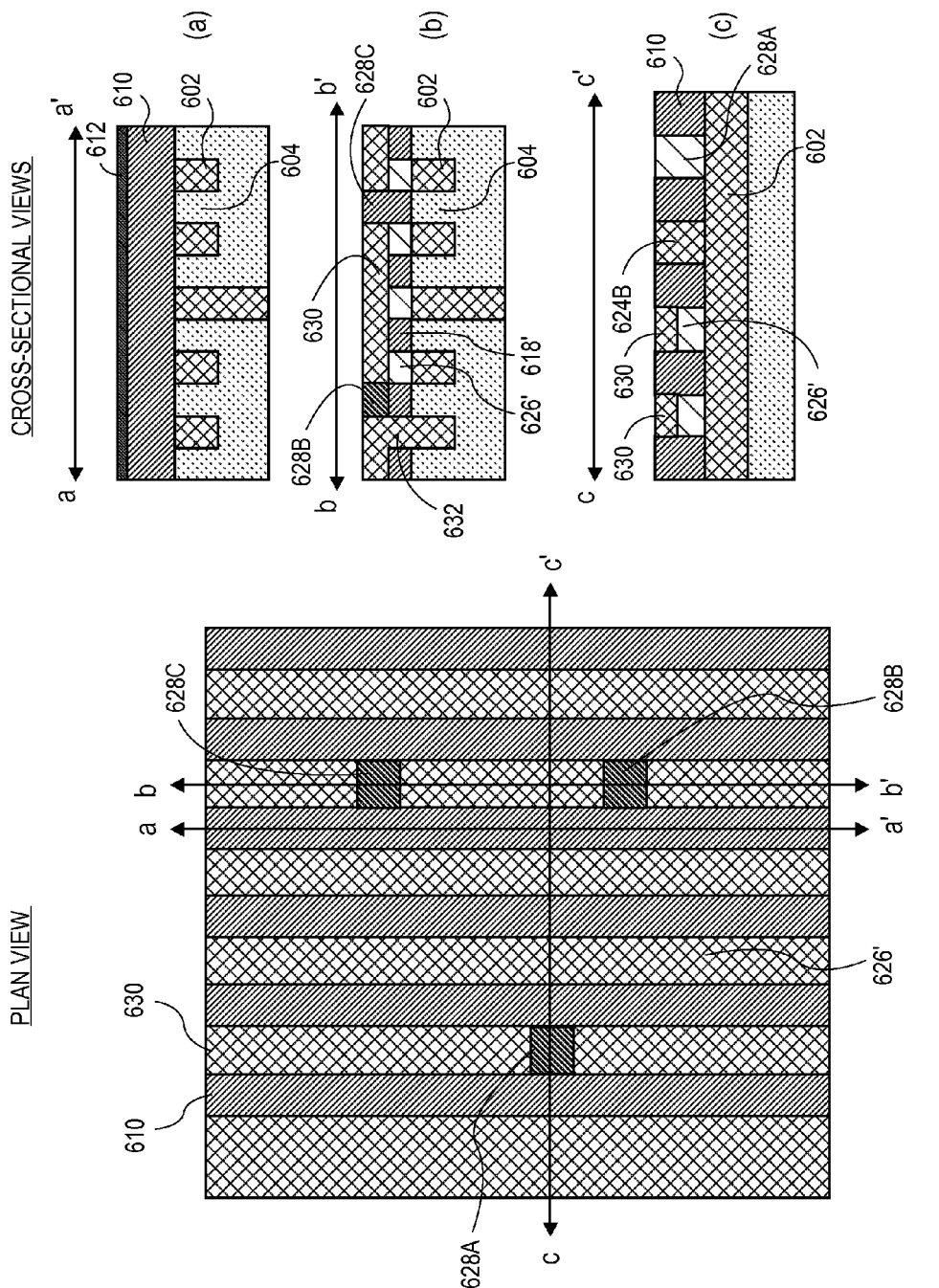

FIG. 6L illustrates a plan view and corresponding cross-sectional views of the structure of FIG. 6K following metal line formation, in accordance with an embodiment of the present invention. Referring to the plan view and corresponding cross-sectional views (a), (b) and (c) taken along axes, a-a', b-b' and c-c', respectively, metal for forming metal interconnect lines is formed conformally above the structure of FIG. 6K. The metal is then planarized, e.g., by CMP, to provide metal lines 630, which are confined to locations above recessed ILD layer 618' and recessed ILD layer 626'. The metal lines 630 are coupled with underlying metal lines 602 through the predetermined via locations 624A, 624B and 624C (624B is shown in cross-sectional view (c); note that for illustrative purposes, another via 632 is depicted directly adjacent plug 628B in cross-sectional view (b) even though this is inconsistent with the previous figures). The metal lines 630 are isolated from one another by ILD lines 610 and are disrupted or broken-up by the preserved plugs 628A, 628B and 628C. Any hardmask remaining on the plug locations and/or on the ILD lines 610 may be removed at this portion of the process flow, as depicted in FIG. 6L. The metal (e.g., copper and associated barrier and seed layers) deposition and planarization process to form metal lines 630 may be that typically used for standard back end of line (BEOL) single or dual damascene processing. In an embodiment, in subsequent fabrication operations, the ILD lines 610 may be removed to provide air gaps between the resulting metal lines 630.

The structure of FIG. 6L may subsequently be used as a foundation for forming subsequent metal line/via and ILD layers. Alternatively, the structure of FIG. 6L may represent the final metal interconnect layer in an integrated circuit. It is to be understood that the above process operations may be practiced in alternative sequences, not every operation need be performed and/or additional process operations may be performed. Furthermore, although the above process flow focused on applications of directed self-assembly (DSA), selective growth processes may be used instead in one or more locations of the process flow. In any case, the resulting structures enable fabrication, by selective metal deposition (e.g., photo-assisted ALD/CVD selective deposition), of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. As such, in an embodiment, offset due to conventional lithograph/dual damascene patterning that must otherwise be tolerated, is not a factor for the resulting structures described herein.

In another aspect, one or more embodiments described herein are directed to fabricating semiconductor devices, such as for PMOS and NMOS device fabrication. For example, photo-assisted ALD or CVD is used to fabricate a workfunction or other metal layer used in a metal oxide semiconductor (MOS) device. As an example of a completed device, FIGS. 7A and 7B illustrate a cross-sectional view and a plan view (taken along the a-a' axis of the cross-sectional view), respectively, of a non-planar semiconductor device having a metal gate layer formed by photo-assisted ALD or CVD, in accordance with an embodiment of the present invention.

Figure 7A:
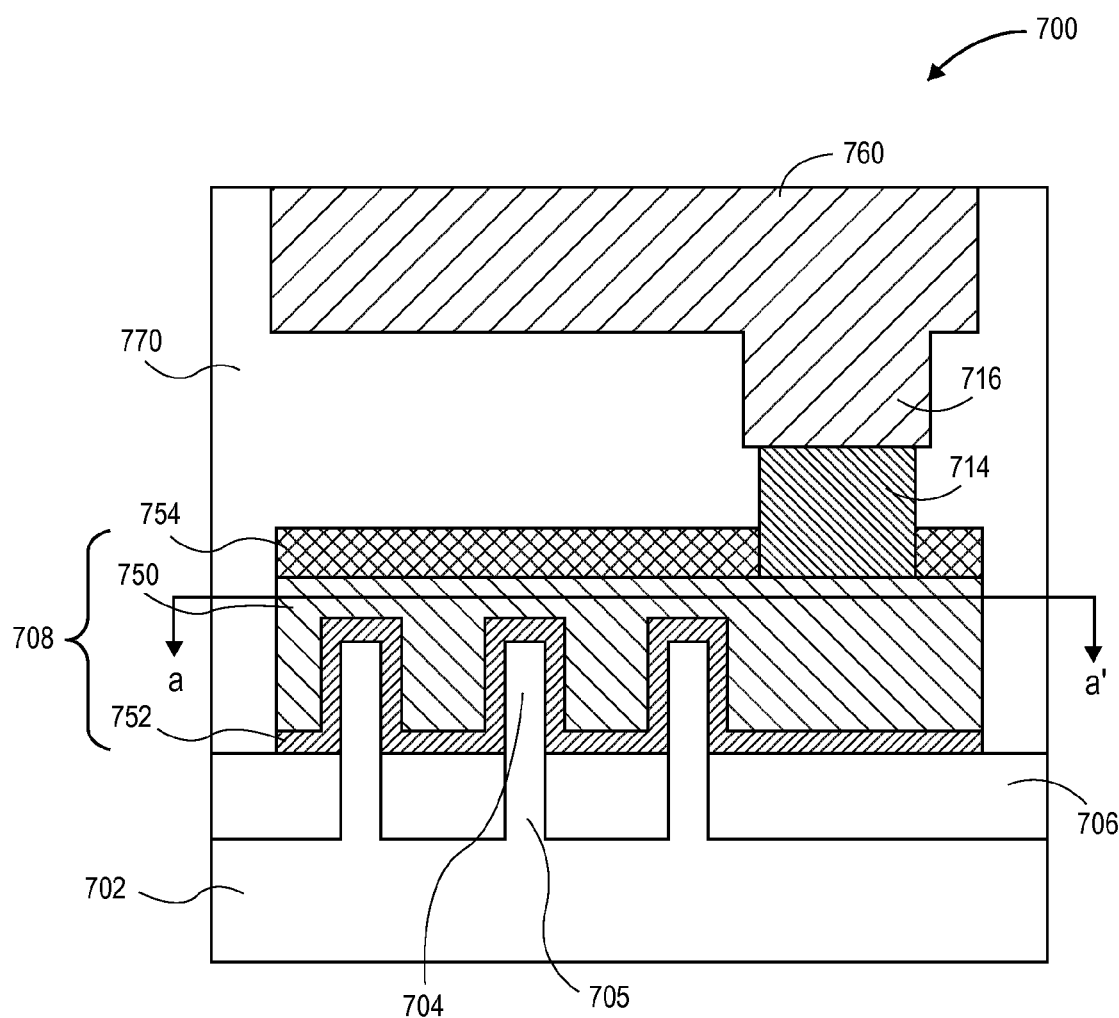
FIG. 7A illustrates a cross-sectional view of a non-planar semiconductor device having fins having a metal gate layer formed by photo-assisted ALD or CVD, in accordance with an embodiment of the present invention.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750 and a gate dielectric layer 752. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. Also seen from the perspective of FIG. 7A, the gate contact 714 is, in one embodiment, disposed over isolation region 706, but not over the non-planar active regions.

Figure 7B:
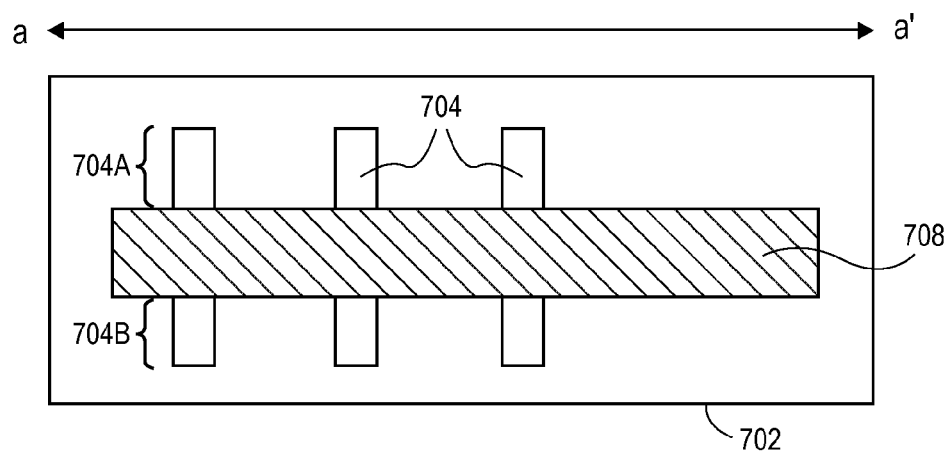
FIG. 7B illustrates a plan view taken along the a-a' axis of the semiconductor device of FIG. 7A, in accordance with an embodiment of the present invention.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, boron or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon mono-crystalline substrate. Bulk substrate 702 may alternatively be composed of a group III-V material. In an embodiment, bulk substrate 702 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a III-V material and the charge-carrier dopant impurity atoms are ones such as, but not limited to, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

Gate line 708 may be composed of a gate electrode stack which includes a gate dielectric layer 752 and a gate electrode layer 750. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In accordance with an embodiment of the present invention, at least a portion of a metal gate is formed by photo-assisted ALD/CVD, as described above in association with FIGS. 1-4, 5A and 5B. In a specific embodiment, the photo-assisted metal ALD/CVD layer is a non-workfunction-setting fill material of the metal gate electrode. In another specific embodiment, the photo-assisted metal ALD/CVD layer is a workfunction-setting fill material of the metal gate electrode.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 714 and overlying gate contact via 716 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). In accordance with another embodiment of the present invention, at least a portion of a gate contact or gate contact via is formed by photo-assisted ALD/CVD, as described above in association with FIGS. 1-4, 5A and 5B.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present invention include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

It is to be appreciated that not all aspects of the processes described above need be practiced to fall within the spirit and scope of embodiments of the present invention. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
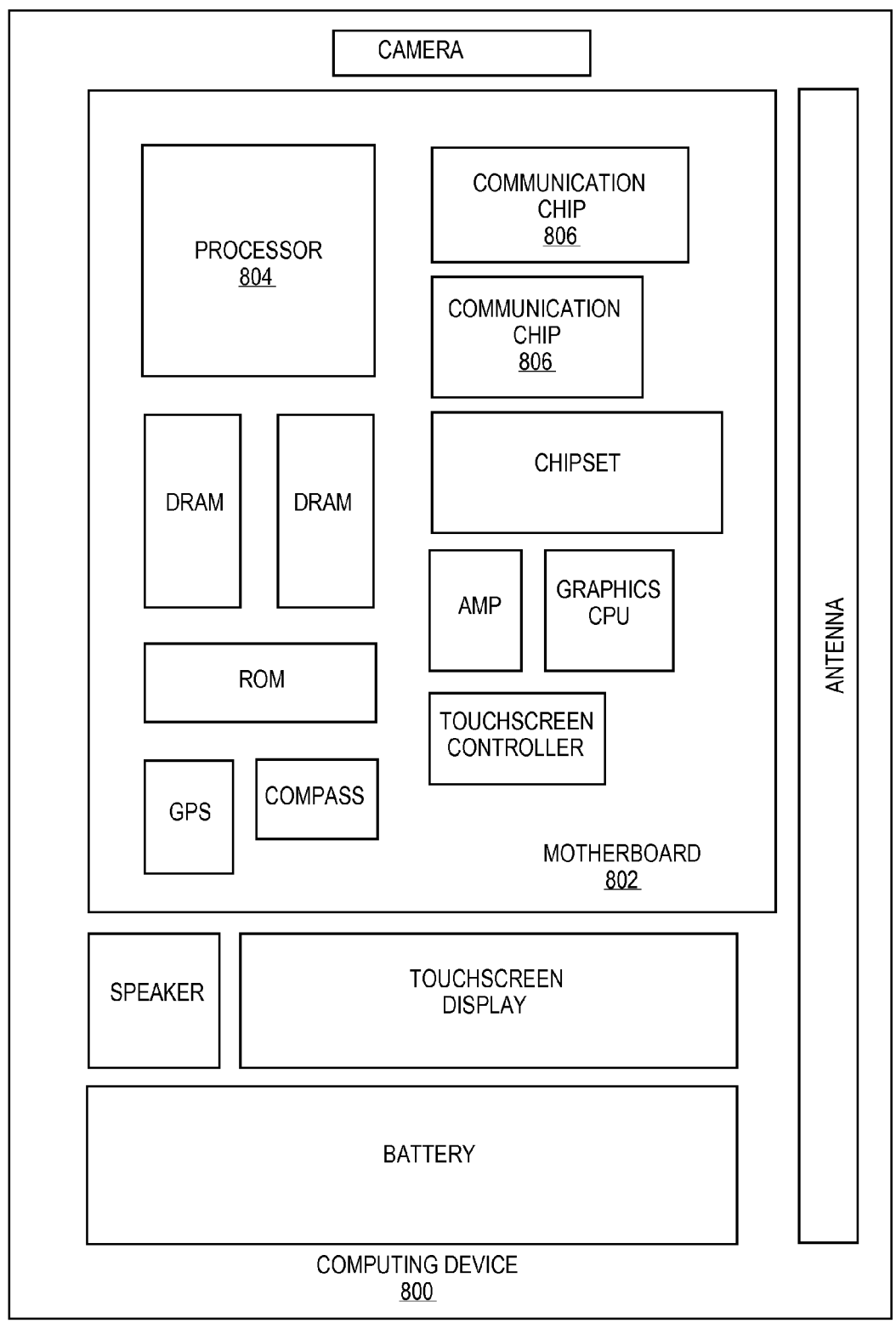
FIG. 8 illustrates a computing device in accordance with one implementation of the invention.

FIG. 8 illustrates a computing device 800 in accordance with one implementation of the invention. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the invention, the integrated circuit die of the processor includes one or more structures, such as metallization structures formed at least in part by photo-assisted metal ALD or MOS transistors including a metal gate layer formed at least in part by photo-assisted metal ALD, built in accordance with implementations of the invention. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of the invention, the integrated circuit die of the communication chip includes one or more structures, s such as metallization structures formed at least in part by photo-assisted metal ALD or MOS transistors including a metal gate layer formed at least in part by photo-assisted metal ALD, built in accordance with implementations of the invention.

In further implementations, another component housed within the computing device 800 may contain an integrated circuit die that includes one or more structures, such as metallization structures formed at least in part by photo-assisted metal ALD or MOS transistors including a metal gate layer formed at least in part by photo-assisted metal ALD, built in accordance with implementations of the invention.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments of the present invention include precursor and process design for photo-assisted metal atomic layer deposition (ALD) and chemical vapor deposition (CVD).

In an embodiment, a method of fabricating a thin metal film involves introducing precursor molecules proximate to a surface on or above a substrate, each of the precursor molecules having one or more metal centers surrounded by ligands. The method also involves depositing a metal layer on the surface by dissociating the ligands from the precursor molecules using a photo-assisted process.

In one embodiment, dissociating the ligands from the precursor molecules using the photo-assisted process involves using a direct photo-assisted process involving delivery of photons directly to the precursor molecules.

In one embodiment, using the direct photo-assisted process involves irradiating at a first wavelength of light to dissociate a first portion of the ligands and, subsequently, irradiating at a second wavelength of light to dissociate the remaining of the ligands.

In one embodiment, dissociating the ligands from the precursor molecules using the photo-assisted process involves using an indirect photo-assisted process involving delivery of photons first to chromophores anchored to the surface, and then from the chromophores to the precursor molecules.

In one embodiment, depositing the metal layer on the surface involves depositing selectively on the surface without depositing on an adjacent, different, surface.

In one embodiment, depositing the metal layer on the surface involves forming the metal layer to a thickness approximately equal to or less than 3 nanometers.

In one embodiment, using the photo-assisted process involves irradiating at a wavelength of light approximately in the range of 150-800 nanometers.

In one embodiment, depositing the metal layer comprises performing the deposition at a temperature approximately in the range of 25-200 degrees Celsius.

In an embodiment, a method of fabricating an interconnect structure for an integrated circuit involves providing a previous layer metallization structure having an alternating metal line and dielectric line first grating pattern having a first direction. The method also involves forming a dielectric line second grating pattern above the previous layer metallization structure, the dielectric line second grating pattern having a second direction, perpendicular to the first direction. The method also involves forming a sacrificial structure above the first grating pattern and between the dielectric lines of the second grating pattern. The method also involves replacing portions of the sacrificial structure above and aligned with the metal lines of the first grating pattern with a first dielectric layer, and replacing portions of the sacrificial structure above and aligned with the dielectric lines of the first grating pattern with a second dielectric layer. The method also involves forming, by using a photo-assisted process, at least a portion of one or more conductive vias in the first dielectric layer, on a surface of exposed portions of the metal lines of the first grating pattern. Using the photo-assisted process involves introducing precursor molecules proximate to the surface of the exposed portions of the metal lines, each of the precursor molecules having one or more metal centers surrounded by ligands. Using the photo-assisted process also involves depositing a metal layer on the surface of the exposed portions of the metal lines by dissociating the ligands from the precursor molecules using photo-dissociation. The method also involves recessing portions of the first and second dielectric layers. The method also involves forming a plurality of metal lines in the recessed portions of the first and second dielectric layers, coupled with the one or more conductive vias, the plurality of metal lines having the second direction.

In one embodiment, dissociating the ligands from the precursor molecules using photo-dissociation involves using a direct photo-dissociation process involving delivery of photons directly to the precursor molecules.

In one embodiment, using the direct photo-dissociation involves irradiating at a first wavelength of light to dissociate a first portion of the ligands and, subsequently, irradiating at a second wavelength of light to dissociate the remaining of the ligands.

In one embodiment, dissociating the ligands from the precursor molecules using photo-dissociation involves using an indirect photo-dissociation process involving delivery of photons first to chromophores anchored to the surface of the exposed portions of the metal lines, and then from the chromophores to the precursor molecules.

In one embodiment, depositing the metal layer on the surface of the exposed portions of the metal lines involves depositing selectively on the surface of the exposed portions of the metal lines without depositing on an adjacent, different, surfaces.

In one embodiment, depositing the metal layer on the surface of the exposed portions of the metal lines involves forming the metal layer to a thickness approximately equal to or less than 3 nanometers.

In one embodiment, using the photo-assisted process involves irradiating at a wavelength of light approximately in the range of 150-800 nanometers.

In one embodiment, depositing the metal layer involves performing the deposition at a temperature approximately in the range of 25-200 degrees Celsius.

In a embodiment, a method of fabricating a semiconductor device involves forming one or more semiconductor fins above a substrate. The method also involves forming a gate dielectric layer conformal with the one or more semiconductor fins. The method also involves forming a gate electrode conformal with the gate dielectric layer. Forming at least a portion of the gate electrode involves introducing precursor molecules proximate to a surface on or above the gate dielectric layer, each of the precursor molecules having one or more metal centers surrounded by ligands, and depositing a metal layer on the surface by dissociating the ligands from the precursor molecules using a photo-assisted process. The method also involves forming source and drain regions in the one or more semiconductor fins, on either side of the gate electrode.

In one embodiment, dissociating the ligands from the precursor molecules using the photo-assisted process involves using a direct photo-assisted process involving delivery of photons directly to the precursor molecules.

In one embodiment, using the direct photo-assisted process involves irradiating at a first wavelength of light to dissociate a first portion of the ligands and, subsequently, irradiating at a second wavelength of light to dissociate the remaining of the ligands.

In one embodiment, dissociating the ligands from the precursor molecules using the photo-assisted process involves using an indirect photo-assisted process involving delivery of photons first to chromophores anchored to the surface, and then from the chromophores to the precursor molecules.

In one embodiment, depositing the metal layer on the surface involves depositing selectively on the surface without depositing on an adjacent, different, surface.

In one embodiment, depositing the metal layer on the surface involves forming the metal layer to a thickness approximately equal to or less than 3 nanometers.

In one embodiment, using the photo-assisted process involves irradiating at a wavelength of light approximately in the range of 150-800 nanometers.

In one embodiment, depositing the metal layer involves performing the deposition at a temperature approximately in the range of 25-200 degrees Celsius.

What is claimed is:

1. A method fabricating an interconnect structure for an integrated circuit, the method comprising:
   providing a previous layer metallization structure comprising an alternating metal line and dielectric line first grating pattern having a first direction;
   forming a dielectric line second grating pattern above the previous layer metallization structure, the dielectric line second grating pattern having a second direction, perpendicular to the first direction;
   forming a sacrificial structure above the first grating pattern and between the dielectric lines of the second grating pattern;
   replacing portions of the sacrificial structure above and aligned with the metal lines of the first grating pattern with a first dielectric layer, and replacing portions of the sacrificial structure above and aligned with the dielectric lines of the first grating pattern with a second dielectric layer;
   forming, by using a photo-assisted process, at least a portion of one or more conductive vias in the first dielectric layer, on a surface of exposed portions of the metal lines of the first grating pattern, wherein using the photo-assisted process comprises:
   introducing precursor molecules proximate to the surface of the exposed portions of the metal lines, each of the precursor molecules comprising one or more metal centers surrounded by ligands; and
   depositing a metal layer on the surface of the exposed portions of the metal lines by dissociating the ligands from the precursor molecules using photo-dissociation;
   recessing portions of the first and second dielectric layers; and
   forming a plurality of metal lines in the recessed portions of the first and second dielectric layers, coupled with the one or more conductive vias, the plurality of metal lines having the second direction.

2. The method of claim 1, wherein dissociating the ligands from the precursor molecules using photo-dissociation comprises using a direct photo-dissociation process involving delivery of photons directly to the precursor molecules.

3. The method of claim 2, wherein using the direct photo-dissociation comprises irradiating at a first wavelength of light to dissociate a first portion of the ligands and, subsequently, irradiating at a second wavelength of light to dissociate the remaining of the ligands.

4. The method of claim 1, wherein dissociating the ligands from the precursor molecules using photo-dissociation comprises using an indirect photo-dissociation process involving delivery of photons first to chromophores anchored to the surface of the exposed portions of the metal lines, and then from the chromophores to the precursor molecules.

5. The method of claim 1, wherein depositing the metal layer on the surface of the exposed portions of the metal lines comprises depositing selectively on the surface of the exposed portions of the metal lines without depositing on an adjacent, different, surfaces.

6. The method of claim 1, wherein depositing the metal layer on the surface of the exposed portions of the metal lines comprises forming the metal layer to a thickness approximately equal to or less than 3 nanometers.

7. The method of claim 1, wherein using the photo-assisted process comprises irradiating at a wavelength of light approximately in the range of 150-800 nanometers.

8. The method of claim 1, wherein depositing the metal layer comprises performing the deposition at a temperature approximately in the range of 25-200 degrees Celsius.

* * * * *